(12) United States Patent
Yoshimoto

(10) Patent No.: US 10,062,761 B2
(45) Date of Patent: Aug. 28, 2018

(54) METHOD FOR MANUFACTURING SEMICONDUCTOR DEVICE

(71) Applicant: FUJI ELECTRIC CO., LTD., Kawasaki-shi (JP)

(72) Inventor: Atsushi Yoshimoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/730,851

(22) Filed: Jun. 4, 2015

(65) Prior Publication Data

US 2015/0270361 A1 Sep. 24, 2015

Related U.S. Application Data

(63) Continuation of application No. PCT/JP2014/002499, filed on May 12, 2014.

(30) Foreign Application Priority Data

May 31, 2013 (JP) .................................. 2013-114979

(51) Int. Cl.
*H01L 21/336* (2006.01)
*H01L 21/332* (2006.01)
(Continued)

(52) U.S. Cl.
CPC .... *H01L 29/4236* (2013.01); *H01L 21/02233* (2013.01); *H01L 21/26513* (2013.01);
(Continued)

(58) Field of Classification Search
CPC ........... H01L 29/4236; H01L 21/02233; H01L 21/028035; H01L 21/768; H01L 29/0619;
(Continued)

(56) References Cited

U.S. PATENT DOCUMENTS 6,072,214 A * 6/2000 Herzer ................ H01L 29/0696
257/139
6,462,387 B1 * 10/2002 Lai .................... H01L 27/11556
257/315
(Continued)

FOREIGN PATENT DOCUMENTS

EP 2549539 A1 1/2013
EP 2985790 A1 2/2016
(Continued)

OTHER PUBLICATIONS

Office Action issued in JP2015-519623, dated Nov. 10, 2015. English translation provided.
(Continued)

*Primary Examiner* — Dzung Tran
(74) *Attorney, Agent, or Firm* — Rossi, Kimms & McDowell LLP

(57) ABSTRACT

A method for manufacturing a semiconductor device includes steps of forming a trench in a surface of a semiconductor substrate of a first conductivity type in a depth direction; forming a conductive layer in the trench, with a first insulating film interposed therebetween; dividing the conductive layer into a gate electrode and an in-trench wiring layer which face each other in the trench and filling a gap between the gate electrode and the in-trench wiring layer with a second insulating film; introducing second-conductivity-type impurities into the entire surface of the semiconductor substrate to form a channel forming region of a second conductivity type; and selectively forming a main electrode region of the first conductivity type in a portion of the channel forming region which is provided along an opening portion of the trench so as to come into contact with the opening portion.

16 Claims, 34 Drawing Sheets

(51) Int. Cl.
| | |
|---|---|
| *H01L 29/66* | (2006.01) |
| *H01L 29/423* | (2006.01) |
| *H01L 29/739* | (2006.01) |
| *H01L 21/02* | (2006.01) |
| *H01L 21/265* | (2006.01) |
| *H01L 21/28* | (2006.01) |
| *H01L 21/768* | (2006.01) |
| *H01L 29/40* | (2006.01) |
| *H01L 29/06* | (2006.01) |
| *H01L 29/78* | (2006.01) |

(52) U.S. Cl.
CPC ...... *H01L 21/28035* (2013.01); *H01L 21/768* (2013.01); *H01L 29/0619* (2013.01); *H01L 29/0696* (2013.01); *H01L 29/407* (2013.01); *H01L 29/66348* (2013.01); *H01L 29/66734* (2013.01); *H01L 29/7397* (2013.01); *H01L 29/7813* (2013.01); *H01L 21/02255* (2013.01); *H01L 29/0692* (2013.01); *H01L 29/42376* (2013.01)

(58) Field of Classification Search
CPC ......... H01L 29/66348; H01L 29/66734; H01L 29/7397; H01L 21/02255; H01L 29/0692; H01L 29/42376
USPC ........ 438/138, 270; 257/139, 144, 288, 390, 257/E29.118
See application file for complete search history.

(56) References Cited

U.S. PATENT DOCUMENTS

| | | | |
|---|---|---|---|
| 6,815,769 B2 | 11/2004 | Pfirsch et al. | |
| 8,653,588 B2 | 2/2014 | Watanabe et al. | |
| 2003/0160270 A1 | 8/2003 | Pfirsch et al. | |
| 2005/0263852 A1* | 12/2005 | Ogura | ................. H01L 29/0834 257/565 |
| 2006/0049456 A1 | 3/2006 | Sugiyama | |
| 2006/0216895 A1 | 9/2006 | Zeng et al. | |
| 2007/0013021 A1* | 1/2007 | Zhang | ................. H01L 29/0692 257/500 |
| 2008/0185638 A1* | 8/2008 | Yamaoka | ........... H01L 29/4236 257/330 |
| 2012/0061723 A1 | 3/2012 | Ishii | |
| 2016/0027906 A1 | 1/2016 | Onozawa | |

FOREIGN PATENT DOCUMENTS

| | | |
|---|---|---|
| JP | 2002184980 A | 6/2002 |
| JP | 2004207706 A | 7/2004 |
| JP | 2009200103 A | 9/2009 |
| JP | 2012064641 A | 3/2012 |
| JP | 2012248604 A | 12/2012 |

OTHER PUBLICATIONS

International Search Report issued in PCT/JP2014/002499, dated Jul. 22, 2014. English translation provided.
Extended European Search Report issued in European Application No. 14803515.7 dated May 20, 2016.

* cited by examiner

METHOD FOR MANUFACTURING SEMICONDUCTOR DEVICE

BACKGROUND OF THE INVENTION

A. Field of the Invention

The present invention relates to a method for manufacturing a semiconductor device, and more particularly, to the improvement of a method for manufacturing an insulated gate semiconductor device having a trench gate structure.

B. Description of the Related Art

With the development of a technique for reducing the power consumption of power conversion apparatuses, there are growing expectations for a technique for reducing the power consumption of a power device which plays a key role in the power conversion apparatus. For example, among various types of power devices, an insulated gate bipolar transistor (IGBT) generally has been used which can reduce an on-voltage using a conductivity modulation effect and whose gate is easily controlled for voltage driving. FIG. 24 illustrates an example of the structure of the IGBT. In FIG. 24, for ease of understanding, a portion of hatching indicating a cross section is omitted. In a planar gate IGBT 100 illustrated in the cross-sectional view of FIG. 24(a), a gate electrode 101a is provided along the surface of a wafer to form a planar gate structure. In a trench gate IGBT 200 illustrated in the cross-sectional view of FIG. 24(b), a gate electrode 203 is provided in a trench 201, which vertically extends from a stripe-shaped plane pattern on the surface of a wafer in a depth direction, with an oxide film 202 interposed therebetween, to form a trench gate structure. In the trench gate IGBT 200, an n channel (not illustrated) is formed along a p-type base region 204 which is provided on both side walls of the trench 201. I.e., the n channel is vertically formed in the surface of the substrate. Therefore, it is easy to reduce the opening width of the trench and the gap between the trenches. As a result, it is easy to increase channel density, as compared to the planar gate IGBT. In addition, it is possible to increase the density of the channels and to reduce the on-voltage. Therefore, in recent years, the application of the trench gate IGBT has increased.

For the trench gate structure which can increase channel density and reduce the on-voltage, a drawing of a trench gate structure is disclosed in which a gate electrode film formed on the inner surface of a trench is divided at the bottom (JP 2009-200103 A (FIG. 1 and paragraph 0024)). In addition, JP 2009-200103 A discloses a gate electrode division method in which a polysilicon film that is uniformly formed in the trench is etched back by anisotropic etching. U.S. Pat. No. 6,815,769 (FIG. 1) discloses a structure in which a polysilicon layer filled in a trench is divided at the bottom, only the polysilicon layer provided on a side wall close to an $n^+$ emitter region and a p-type base region (active mesa region) is divided as a gate electrode, and the polysilicon layer close to a floating mesa region is not connected to the gate electrode, but is connected to an emitter electrode. In addition, U.S. Pat. No. 6,815,769 discloses a method for dividing the polysilicon layer. I.e., a polysilicon layer which is thick enough not to fill up the trench is formed. With the polysilicon layer remaining on the surface of the substrate, the polysilicon layer at the bottom of the trench is cut, using the oxide film as a mask. The gap between the polysilicon layers in the trench is filled with, for example, an oxide film and the polysilicon layers on both side walls are insulated from each other. Then, a drawing portion for the polysilicon layer on the surface of the substrate is formed.

FIGS. 25 to 34 are cross-sectional views sequentially illustrating the steps of a main process for manufacturing the trench gate IGBT according to the related art. As illustrated in FIG. 25, a trench 302 is formed from the surface of a silicon substrate 301 in a vertical direction by anisotropic plasma etching using, for example, the known technique of reactive ion etching (RIE). When the trench 302 is formed in the surface of the silicon substrate 301, an active mesa region 305 and a floating mesa region 306, which are partitioned by the trench 2, are formed. Then, as illustrated in FIG. 26, a gate oxide film 303a is formed in the trench 302.

As illustrated in FIG. 27, a doped polysilicon layer 304 which is thick enough not to fill up the trench 302 is formed in the trench 302 by, for example, a chemical vapor deposition (CVD) method. For example, the doped polysilicon layer 304 with a thickness of about 0.5 μm is formed in the trench with a width of 2 μm.

The doped polysilicon layer 304 is etched back by anisotropic etching so that portions of the doped polysilicon layer 304 on the surface of the silicon substrate 301 and in the bottom of the trench 302 are removed and portions of the doped polysilicon layer 304 on both side walls of the trench 2 remain, as illustrated in FIG. 28. In this process, the doped polysilicon layer 304 which is formed on the inner wall surface of the trench 302 is divided into two doped polysilicon electrodes 304a and 304b which are arranged on the side wall of the trench 302 in the width direction so as face each other with a gap therebetween. Then, as illustrated in FIG. 29, the gate oxide film 303a on the surface of the silicon substrate 301 is selectively removed by, for example, a chemical mechanical polishing (CMP) method.

Boron (B) ions are implanted into the surface of the silicon substrate 301, using a photoresist 314a formed by photolithography as a mask, in order to form a p-type base region 307 in a mesa-shaped portion of the silicon substrate between adjacent trenches 302, as illustrated in FIG. 30. The photoresist 314a is removed and a heat treatment for activating the implanted boron ions is performed to form the p-type base region 307 (see FIG. 31).

Phosphorous (P) ions are implanted into the surface of the silicon substrate 301, using a photoresist 314b formed by photolithography as a mask, in order to form an $n^+$ emitter region 308, as illustrated in FIG. 31. The photoresist 314b is removed and a heat treatment for activating the implanted phosphorous ions is performed to form the $n^+$ emitter region 308, as illustrated in FIG. 32.

As such, in the trench gate IGBT manufacturing method according to the related art, as illustrated in FIG. 32, the p-type base region 307 and the $n^+$ emitter region 308 are formed in the mesa-shaped portion of the silicon substrate between adjacent trenches 302 by two ion implantation processes. In the two ion implantation processes, the trench 302 is filled with the resist (photoresists 314a and 314b) in order to prevent the implantation of ions into the bottom of the trench 302 where the gate oxide film 303a is exposed.

As illustrated in FIG. 33, the inside of the trench 2, i.e., the gap between two doped polysilicon electrodes, is filled with an oxide film 303c with high embedability, such as a high temperature oxide film (HTO) or a tetraethoxysilane (TEOS) film.

Then, as illustrated in FIG. 34, the oxide film 303c on the p-type base region 307 and the $n^+$ emitter region 308 is selectively removed and opened and the p-type base region 307 and the $n^+$ emitter region 308 come into contact with an emitter electrode 310. As a result, as illustrated in FIG. 34, a trench gate structure is formed in which the doped polysilicon layer 304 is divided into the doped polysilicon electrode 304a close to the active mesa region 305 and the doped polysilicon electrode 304b close to the floating mesa region 306 which are provided on both side walls of the trench 302, with the gate oxide film 303a interposed therebetween.

However, as described above, in the trench gate IGBT manufacturing method according to the related art, in FIGS. 30 and 31 illustrating the trench gate structure manufacturing process, a photolithography process is performed in order to form the p-type base region 307 and the n⁺ emitter region 308 in predetermined regions of the surface of the silicon substrate 301 using selective ion implantation. At that time, the photoresists 314a and 314b get into a concave portion of the trench 302 with a small width. It is necessary to remove the photoresists 314a and 314b in the trench 302 after ion implantation. However, since the trench 302 has a small width of about 2 µm, it is difficult to completely remove the hardened photoresists 314a and 314b. The remaining photoresists 314a and 314b become a contamination source and is one of the causes of low yield.

SUMMARY OF THE INVENTION

The invention has been made in order to solve the above-mentioned problems. I.e., the invention provides a semiconductor device manufacturing method including a process of preventing a photoresist from remaining in a trench.

A method for manufacturing a semiconductor device according to an aspect of the invention includes: a step of forming a trench in a surface of a semiconductor substrate of a first conductivity type in a depth direction; a step of forming a conductive layer in the trench, with a first insulating film interposed therebetween; a step of dividing the conductive layer into a gate electrode and an in-trench wiring layer which face each other in the trench and filling a gap between the gate electrode and the in-trench wiring layer with a second insulating film; a step of introducing second-conductivity-type impurities into the entire surface of the semiconductor substrate to form a channel forming region of a second conductivity type; and a step of selectively forming a main electrode region of the first conductivity type in a portion of the channel forming region which is provided along an opening portion of the trench so as to come into contact with the opening portion.

According to the invention, when a semiconductor device in which two conductors are separately provided on the side wall of a trench so as to face each other in the trench, with a gap interposed therebetween, is manufactured, it is possible to provide a semiconductor device manufacturing method including a process of preventing a photoresist from remaining in the trench.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
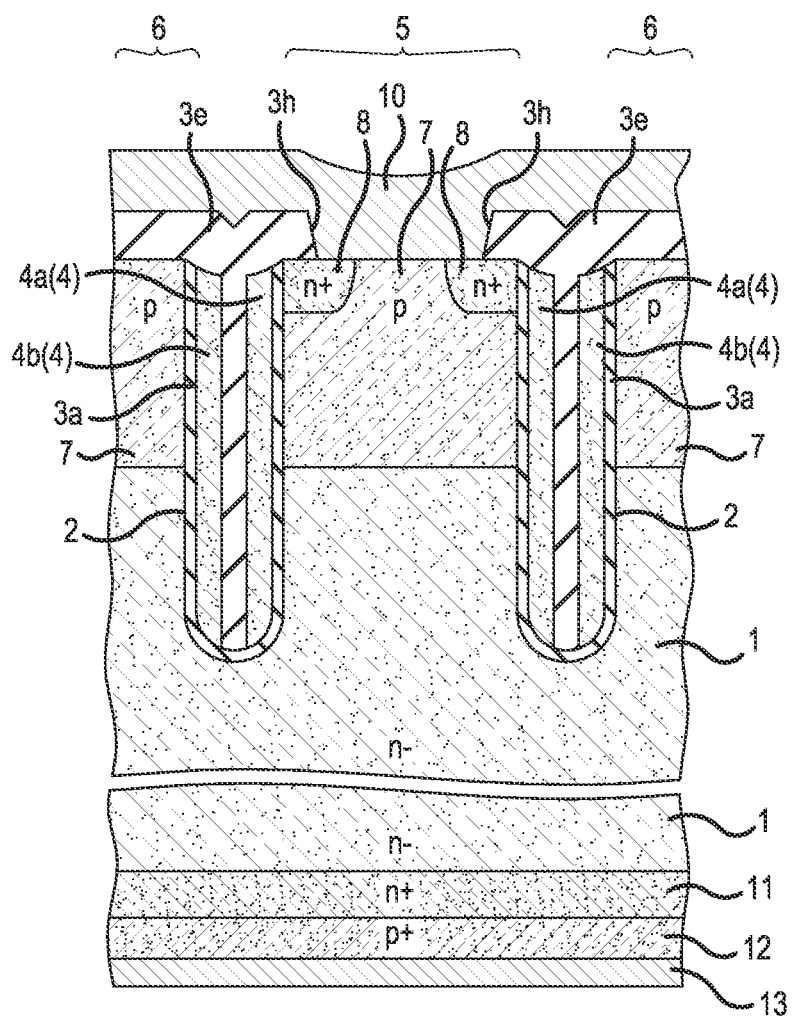
FIG. 1 is an enlarged cross-sectional view illustrating a main portion of a semiconductor device (trench gate IGBT) according to a first embodiment of the invention.

Hereinafter, methods for manufacturing a semiconductor device according to first and second embodiments of the invention will be described in detail with reference to the drawings.

In the specification, a "main electrode region" means a semiconductor region with low specific resistance which is an emitter region or a collector region of an IGBT. In addition, the main electrode region means a source region or a drain region in a field effect transistor (FET) or a static induction transistor (SIT). Therefore, the main electrode region depends on a "semiconductor device." Specifically, when "one semiconductor region" is defined as a "first main electrode region," "the other semiconductor region" is a "second main electrode region." I.e., the "second main electrode region" means a semiconductor region which is an emitter region or a collector region different from the first main electrode region in the IGBT and means a semiconductor region which is a source region or a drain region different from the first main electrode region in the FET or the SIT. In the following first and second embodiments, the description is focused only on the "first main electrode region." Therefore, the "first main electrode region" is referred to as the "main electrode region" for convenience.

In the following description of the first and second embodiments, for example, a first conductivity type is an n type and a second conductivity type is a p type. However, the relationship between the conductivity types may be reversed. I.e., the first conductivity type may be a p type and the second conductivity type may be an n type.

In the specification and the accompanying drawings, in the layers or regions having "n" or "p" appended thereto, an electron or a hole means a majority carrier. In addition, symbols "+" and "−" added to n or p mean that impurity concentration of the semiconductor region is higher and lower than that of a semiconductor region without the symbols "+" and "−".

In the description of the following first and second embodiments and the accompanying drawings, the same components are denoted by the same reference numerals and the description thereof will not be repeated.

In the accompanying drawings described in the first and second embodiment, scales and dimensions are different from the actual scales and dimensions for ease of illustration or understanding. The invention is not limited to the following first and second embodiments and various modifications and changes of the invention can be made without departing from the scope and spirit of the invention.

In the following first and second embodiments, a method for manufacturing a trench gate IGBT, which is a representative example of the "semiconductor device" according to the invention, will be described. In addition, in the following first and second embodiments, doped polysilicon layers are used as conductive layers of two electrodes which are divided and formed in a trench for convenience. However, the conductive layer is not limited to the doped silicon layer. The conductive layer may be a film made of high-melting-point metal, such as tungsten (W) or molybdenum (Mo), a high-melting-point metal silicide film, or a polycide film which is a composite film of silicide and doped polysilicon.

First Embodiment

Figure 15:
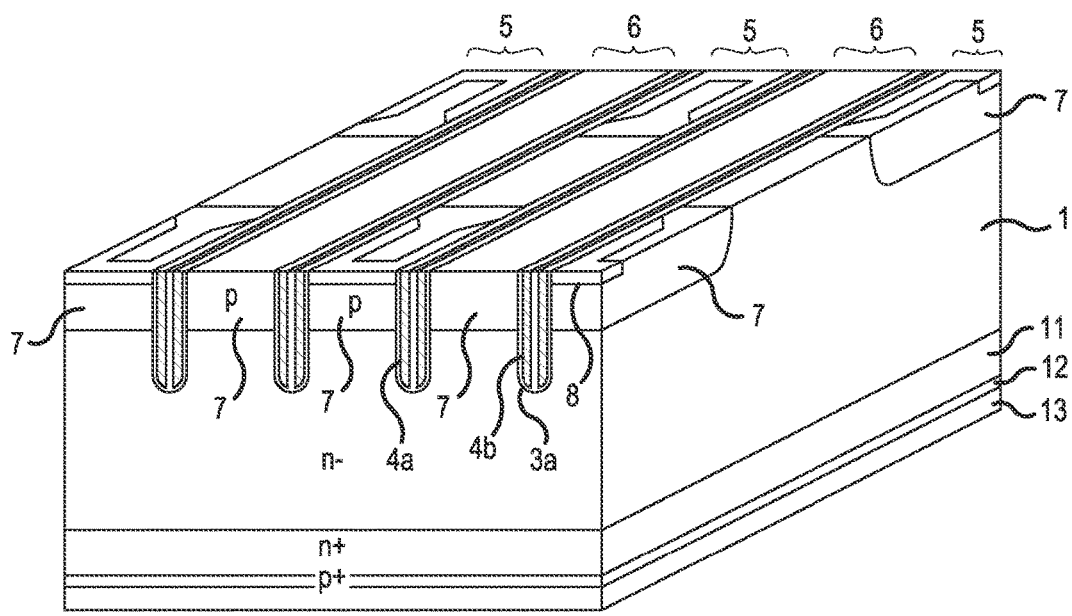
FIG. 15 is a perspective view illustrating a main portion of the semiconductor device according to the first embodiment of the invention.

As illustrated in FIG. 1 and FIG. 15, a semiconductor device according to the first embodiment of the invention is a trench gate IGBT which includes, as a main component, a semiconductor substrate 1 of a first conductivity type (n⁻ type) which is made of, for example, single-crystal silicon.

Active mesa regions 5 which are partitioned by trenches 2 and floating mesa regions 6 are formed in the surface of the semiconductor substrate 1. A plurality of active mesa regions 5 and a plurality of floating mesa regions 6 are alternately arranged in a width direction (lateral direction) perpendicular to the longitudinal direction of the trench 2.

Although not illustrated in detail in the drawings, the semiconductor device according to the first embodiment of the invention has a structure in which a plurality of transistor cells formed in the active mesa region 5 are electrically connected in parallel to each other to obtain a large amount of power. FIG. 1 illustrates only one transistor cell.

The transistor cell mainly includes, for example, the trench 2, a gate insulating film 3a as a first insulating film, a gate electrode 4a, a channel forming region 7 of the second conductivity type (p type), a main electrode region 8 of the first conductivity type ($n^+$ type), a buffer layer 11 of the first conductivity type ($n^+$ type), a collector region (second main electrode region) 12 of a second conductivity type ($p^+$ type), and a collector electrode (second main electrode) 13. The "channel forming region 7" means a base region in the IGBT and means a region having a channel formed in the surface thereof, which is equivalent to a base region of the IGBT, in a semiconductor device other than the IGBT. The "main electrode region 8" means an emitter region of the IGBT, as described above.

The trench 2 extends from the surface of the semiconductor substrate 1 in a depth direction. The trench 2 is formed in, for example, a stripe-shaped plane parallel pattern with a width of about 2 μm and a depth of about 5 μm to 10 μm. The trench 2 is formed by dry etching, such as RIE. The surface of the channel forming region 7 which is opposite to the gate electrode 4a, with the gate insulating film 3a interposed therebetween, corresponds to the position of the side wall of the trench 2, and is controlled to the voltage applied to the gate electrode 4a and a channel is formed in the channel forming region 7.

The gate insulating film 3a is formed along the inner wall of the trench 2 and is, for example, a silicon dioxide film ($SiO_2$) manufactured by performing a thermal oxidation process on the semiconductor substrate 1. The gate insulating film 3a may be a silicon oxide film or a silicon nitride ($Si_3N_4$) film which is formed by a chemical vapor deposition (CVD) method other than the thermal oxidation process, or a laminated film thereof. It is preferable to use the silicon dioxide film formed by the thermal oxidation method which is advantageous to compactness in a power device (power semiconductor device) requiring a high breakdown voltage.

The FET may be a MOS type in which the gate insulating film is an oxide film or an MIS type in which the gate insulating film is an insulating film, such as silicon oxide film, a silicon nitride film, or a laminated film thereof.

In the trench 2, the gate electrode 4a is formed on the side wall of the active mesa region 5, with the gate insulating film 3a interposed therebetween. In the active mesa region 5, the channel forming region 7 is provided on the surface of the semiconductor substrate 1. In the active mesa region 5, the main electrode region 8 is formed in a portion of the channel forming region 7 which is formed along an opening portion of the trench 2 so as to come into contact with the opening portion. The buffer layer 11 and the collector region 12 are formed on the rear surface of the semiconductor substrate 1 opposite to the front surface. The collector electrode 13 is formed over the rear surface of the semiconductor substrate 1 so as to come into contact with the collector region 12.

In the floating mesa region 6, the channel forming region 7 is formed on the surface of the semiconductor substrate 1, similarly to the active mesa region 5. The main electrode region 8 is not formed in the channel forming region 7 in the floating mesa region 6, unlike the active mesa region 5. In the trench 2, an in-trench wiring layer 4b is formed on the side wall of the floating mesa region 6, with the gate insulating film 3a interposed therebetween. The in-trench wiring layer 4b is electrically connected to an emitter electrode 10, which will be described below, in order to reduce feedback capacity.

The gate electrode 4a and the in-trench wiring layer 4b form a conductive layer 4 and are, for example, doped polysilicon layers which are doped with impurities and have low specific resistance. In the trench 2, the conductive layer 4 is divided into two opposite conductors (wiring layers) which are provided on the side wall of the trench 2 in the width direction so as to face each other, with a gap therebetween. In this way the gate electrode 4a and the in-trench wiring layer 4b are formed.

The gate electrode 4a and the in-trench wiring layer 4b are electrically insulated from each other by an oxide film 3e which is a second insulating film provided in a gap between the electrodes. The oxide film 3e is also formed on the surface of the semiconductor substrate 1.

The emitter electrode 10 is formed on the surface of the semiconductor substrate 1, with the oxide film 3e as an insulating film interposed therebetween. The emitter electrode 10 is electrically connected to the channel forming region 7 and the main electrode region 8 through an opening portion 3h formed in the oxide film 3e.

Figure 9:
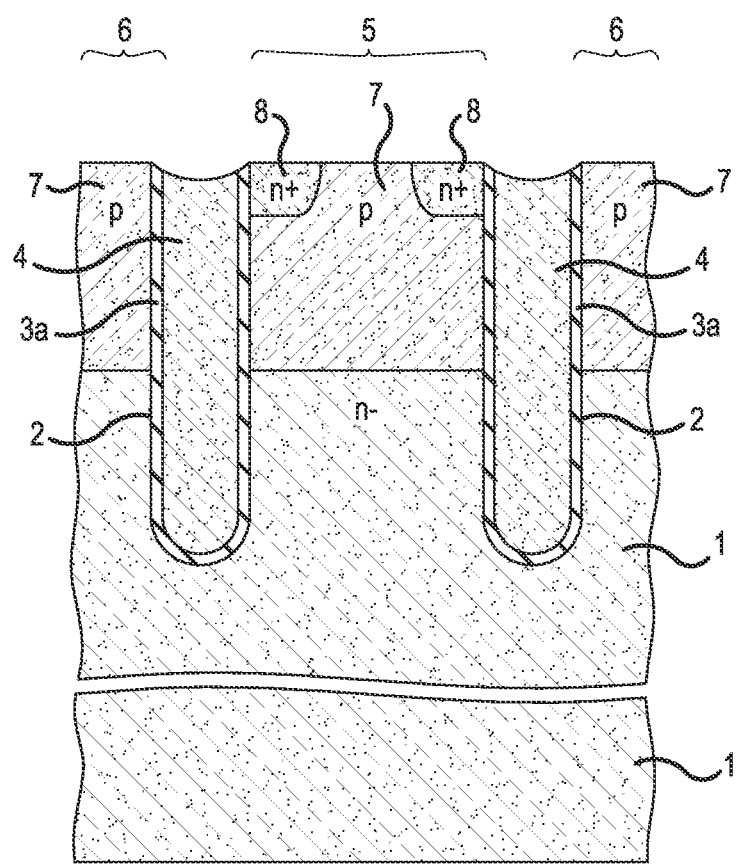
FIG. 9 is a cross-sectional view illustrating a main portion of the flow of the process of manufacturing the semiconductor device according to the first embodiment of the invention.
Figure 10:
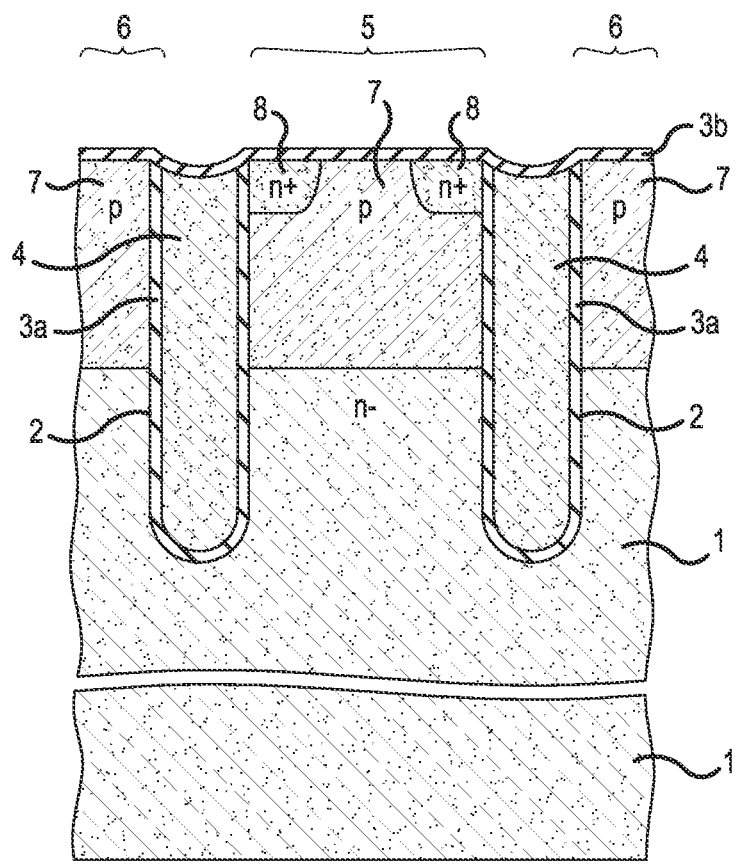
FIG. 10 is a cross-sectional view illustrating a main portion of the flow of the process of manufacturing the semiconductor device according to the first embodiment of the invention.

In this embodiment, the surface pattern of the main electrode region 8 comes into contact with the surface of the trench 2 along the opening portion. However, as illustrated in FIGS. 1 and 15, the surface pattern of the main electrode region 8 is not a continuous pattern, but is preferably formed in the surface of a portion of the substrate between the trenches 2 at a predetermined interval. In this structure, a region in which the main electrode region 8 is formed is the active mesa region 5 and a region in which the main electrode region 8 is not formed is the floating mesa region 6. As illustrated in FIGS. 9 and 10, the channel forming regions 7 in both the regions 5 and 6 may have the same depth. It is preferable that the depth of the channel forming region 7 in the floating mesa region 6 be larger than that of the trench 2 in order to reduce electric field intensity at the bottom of the trench 2 (not illustrated).

Figure 2:
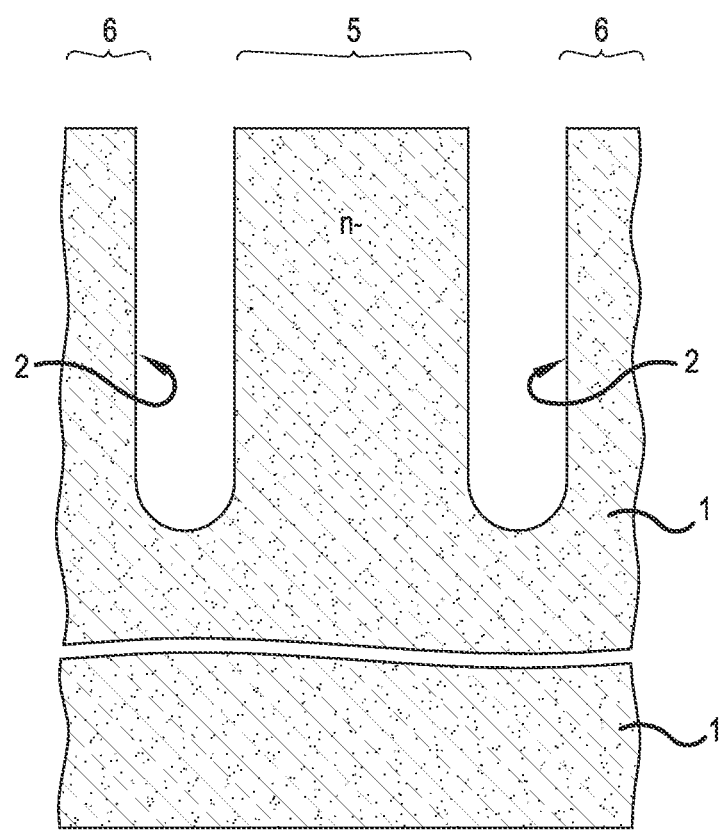
FIG. 2 is a cross-sectional view illustrating a main portion of the flow of a process of manufacturing the semiconductor device (trench gate IGBT) according to the first embodiment of the invention.
Figure 3:
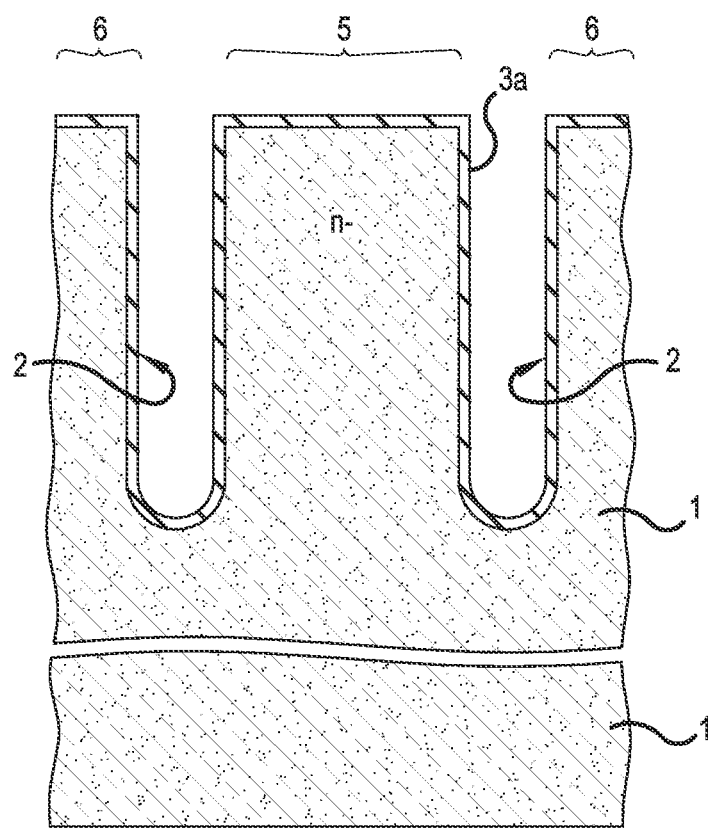
FIG. 3 is a cross-sectional view illustrating a main portion of the flow of the process of manufacturing the semiconductor device according to the first embodiment of the invention.

Next, a method for manufacturing the semiconductor device (trench gate IGBT) according to the first embodiment of the invention will be described with reference to FIGS. 2 to 14. First, the semiconductor substrate 1 illustrated in FIG. 2 is prepared. Then, as illustrated in FIG. 2, the trench 2 is formed so as to extend from the surface of the semiconductor substrate 1 in the depth direction, for example, the vertical direction. The trench 2 is formed by dry etching such as RIE. The active mesa region 5 and the floating mesa region 6 which are partitioned by the trenches 2 are formed in the surface of the semiconductor substrate 1 by the above-mentioned process. As illustrated in FIG. 3, the gate insulating film 3a, which is a silicon dioxide film, is formed as the first insulating film in the trench 2 by, for example, a thermal oxidation process.

Figure 4:
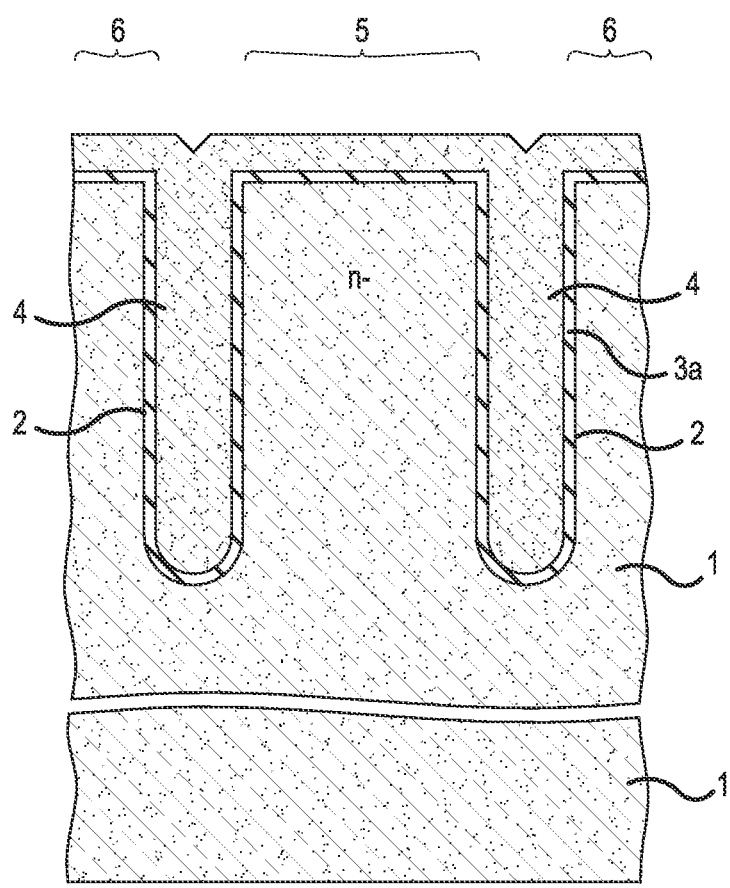
FIG. 4 is a cross-sectional view illustrating a main portion of the flow of the process of manufacturing the semiconductor device according to the first embodiment of the invention.

As illustrated in FIG. 4, a doped polysilicon layer which is doped with impurities and has low specific resistance is formed with a sufficient thickness to fill up the trench 2 as the conductive layer 4 in the trench 2. For example, the conductive layer 4 with a thickness of about 2.5 μm is formed in the trench with a width of 2 μm. The conductive layer 4 is formed by, for example, a CVD method.

Figure 5:
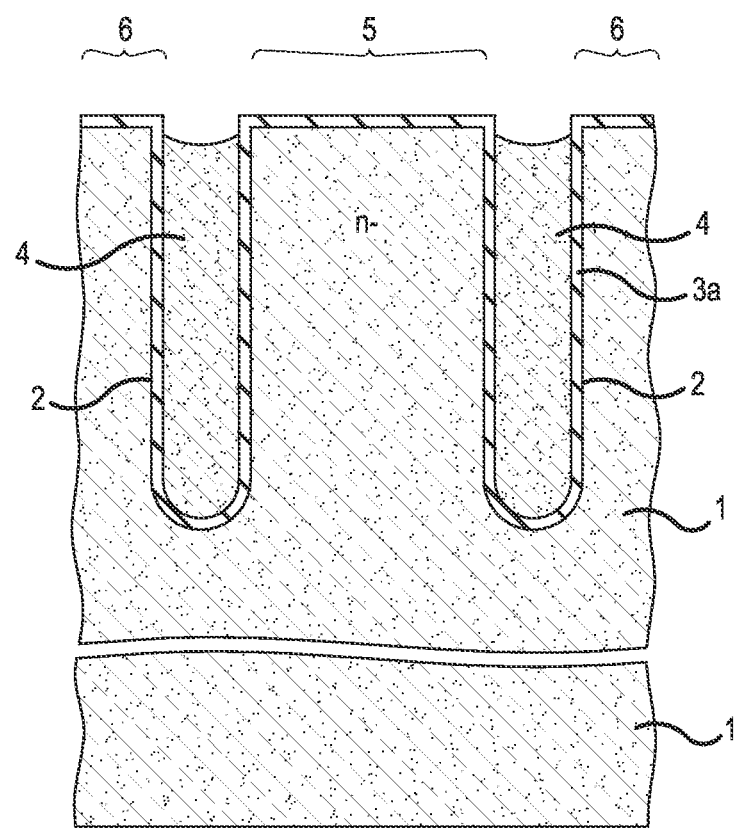
FIG. 5 is a cross-sectional view illustrating a main portion of the flow of the process of manufacturing the semiconductor device according to the first embodiment of the invention.
Figure 6:
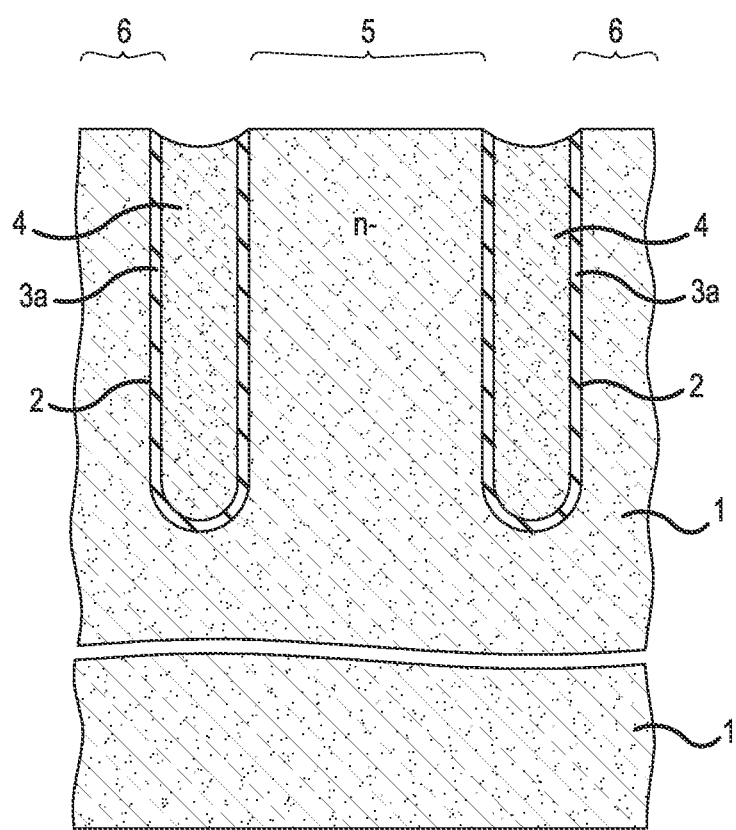
FIG. 6 is a cross-sectional view illustrating a main portion of the flow of the process of manufacturing the semiconductor device according to the first embodiment of the invention.

The conductive layer 4 is etched back by dry etching, such as RIE, so that the conductive layer 4 on the surface of the semiconductor substrate 1 and the trench 2 is selectively removed, as illustrated in FIG. 5. Then, the gate insulating film 3a on the surface of the semiconductor substrate 1 is removed by, for example, wet etching so that the surface of the semiconductor substrate 1 is exposed. In this way, as illustrated in FIG. 6, the gate insulating film 3a and the conductive layer 4 are selectively buried only in the trench 2 and the surface of the semiconductor substrate 1 is substantially flat.

Figure 7:
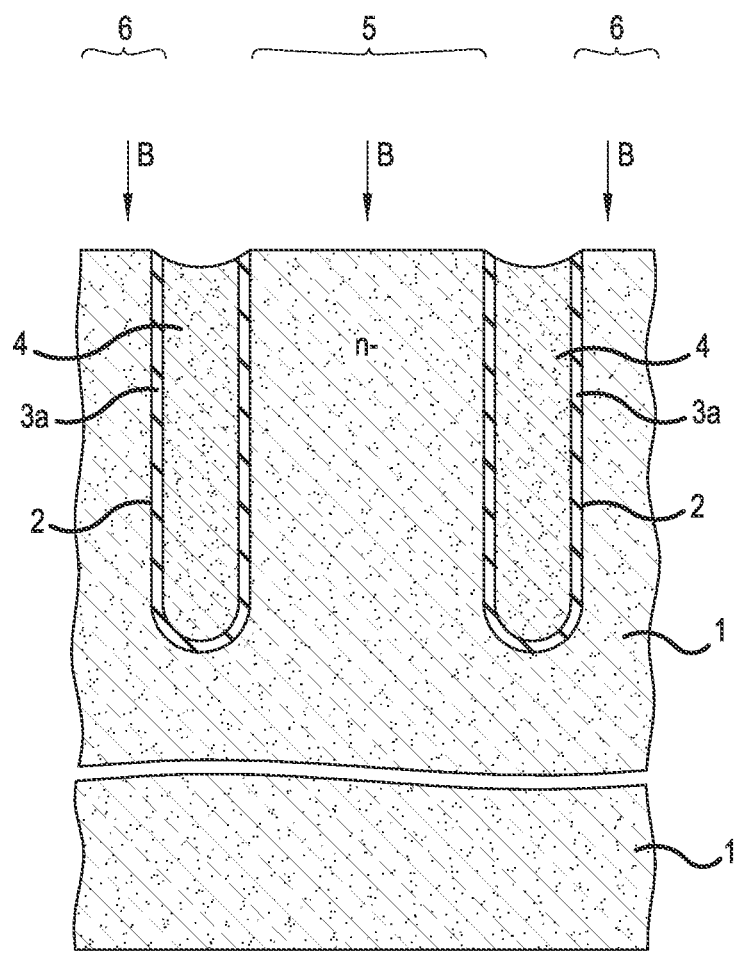
FIG. 7 is a cross-sectional view illustrating a main portion of the flow of the process of manufacturing the semiconductor device according to the first embodiment of the invention.
Figure 8:
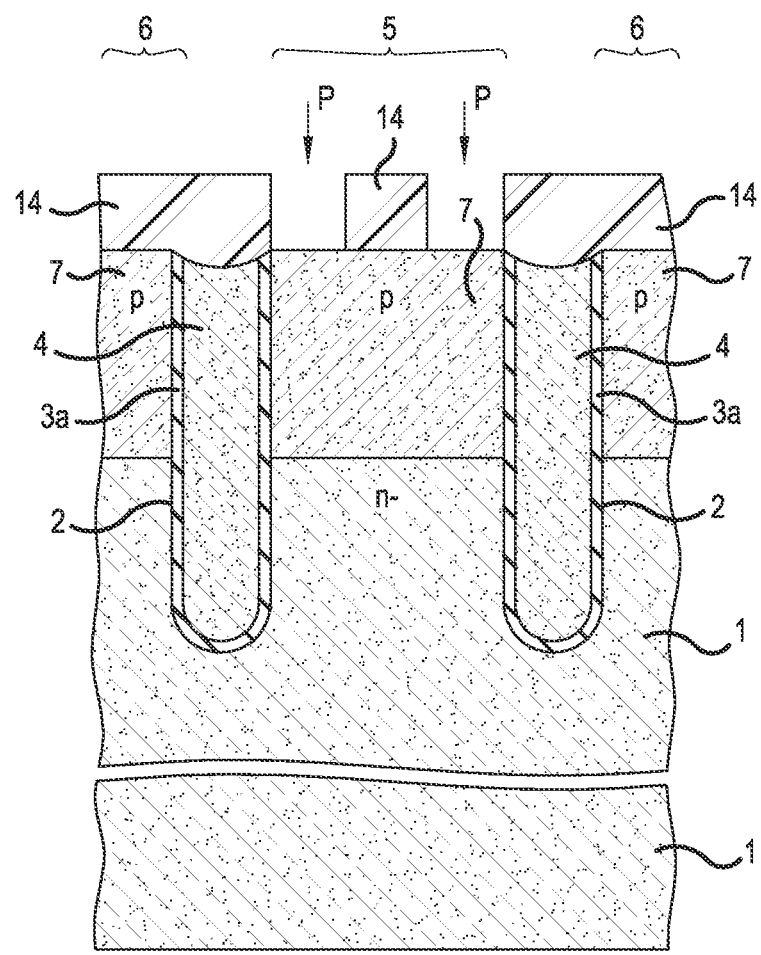
FIG. 8 is a cross-sectional view illustrating a main portion of the flow of the process of manufacturing the semiconductor device according to the first embodiment of the invention.

The channel forming region 7 of the second conductivity type (p type) and the main electrode region 8 of the first conductivity type ($n^+$) are formed on the surface of a portion of the semiconductor substrate 1 between adjacent trenches 2 by photolithography and ion implantation. First, as illustrated in FIG. 7, for example, boron (B) ions are implanted as second-conductivity-type impurity ions into the entire surface of the semiconductor substrate 1 in order to form the channel forming region 7. In the ion implantation process, it is possible to implant ions into the entire surface of the semiconductor substrate 1, without using a photoresist mask, since the trench 2 has been filled with the conductive layer 4 and it is not necessary to protect the inside or bottom of the trench 2. Then, a heat treatment for activating the implanted boron ions is performed to form the channel forming region 7 which has been doped with the second-conductivity-type impurities by the ion implantation process, as illustrated in FIG. 8. In this way, the active mesa region 5 is defined between the trenches 2. The channel forming region 7 is also formed in the floating mesa region 6. The surface of the channel forming region 7 which faces the side wall of the trench 2 is a portion in which a channel is formed.

Then, as illustrated in FIG. 8, for example, phosphorous (P) ions are selectively implanted as first-conductivity-type impurity ions, using a photoresist 14 which is formed by photolithography as an impurity ion implantation mask, in order to form the main electrode region 8. Here, in this ion implantation process, the photoresist 14 is used as the impurity ion implantation mask. However, since the trench 2 has been filled with the conductive layer 4, the photoresist does not get into the trench 2 and it is not necessary to remove the photoresist after the ion implantation process. Then, the photoresist 14 is removed and a heat treatment for activating the implanted phosphorous ions is performed to form the main electrode region 8 which is doped with phosphorous as impurities in the channel forming region 7 in the active mesa region 5, as illustrated in FIG. 9. In this process, the main electrode region 8 is not formed in the floating mesa region 6.

In this way, the channel forming region 7 and the main electrode region 8 are formed. Therefore, it is possible to form the channel forming region 7 and the main electrode region 8 in the surface of the active mesa region 5, while preventing the photoresist from remaining in the trench 2. The main electrode region 8 is formed in a surface layer of the channel forming region 7.

Figure 11:
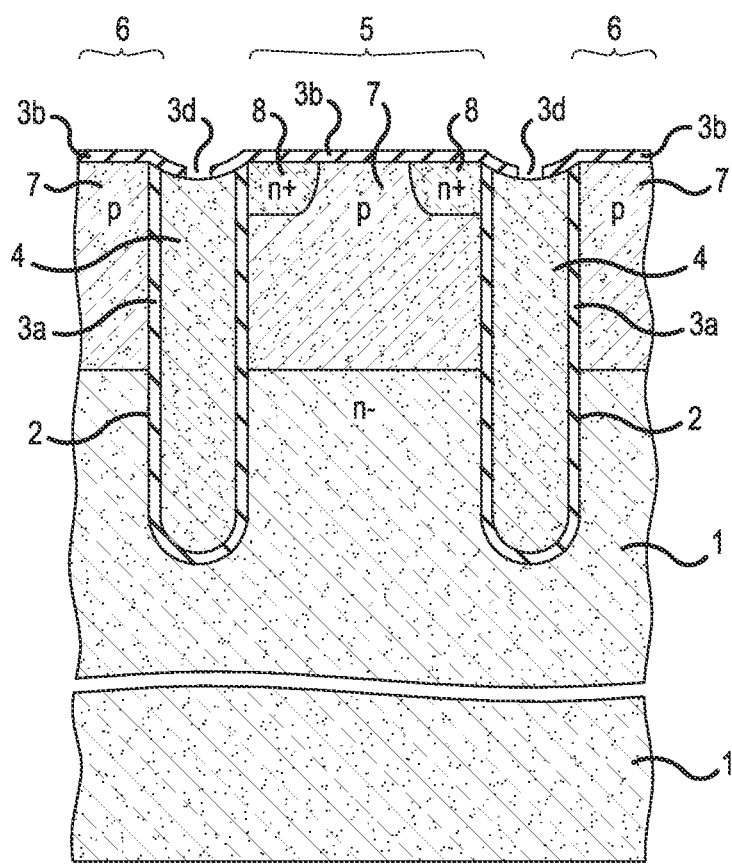
FIG. 11 is a cross-sectional view illustrating a main portion of the flow of the process of manufacturing the semiconductor device according to the first embodiment of the invention.

As illustrated in FIG. 10, an oxide film 3b is deposited as an insulating film on the surface of the semiconductor substrate 1 by, for example, a CVD method. Then, the center of the oxide film 3b on the conductive layer 4 which is buried in the trench 2 with the stripe-shaped surface pattern, i.e., a portion of the oxide film 3b corresponding to the center of the trench 2 in the width direction, is etched along the stripe-shaped pattern of the trench 2 by photolithography and an opening portion 3d is formed in the oxide film 3b, as illustrated in FIG. 11. The opening portion 3d is formed in a stripe-shaped pattern, similarly to the stripe-shaped pattern of the trench 2.

Figure 12:
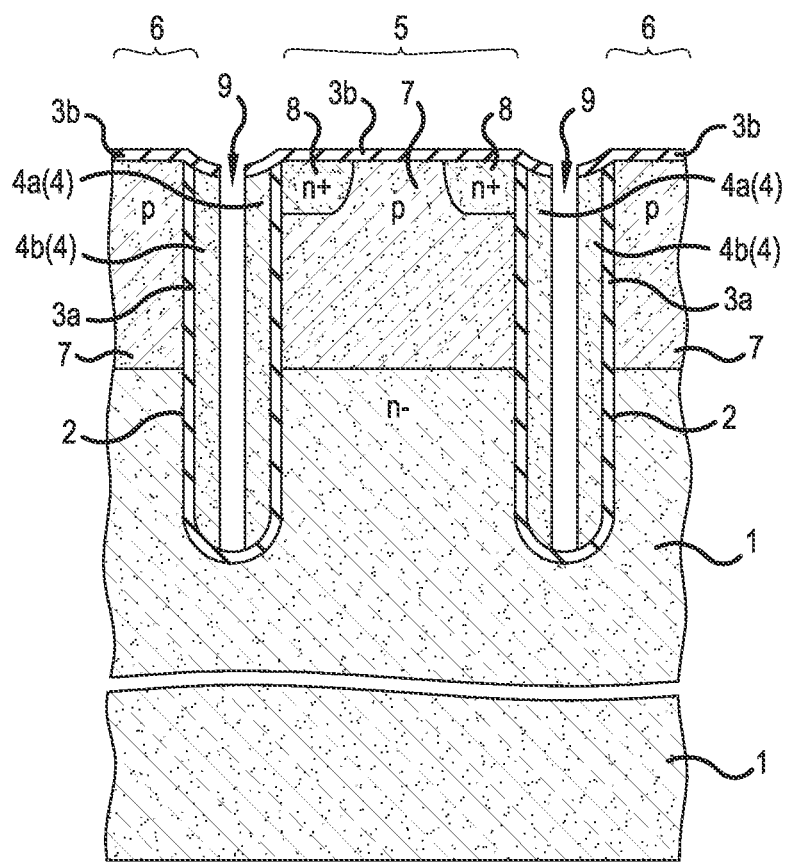
FIG. 12 is a cross-sectional view illustrating a main portion of the flow of the process of manufacturing the semiconductor device according to the first embodiment of the invention.

A central portion of the conductive layer 4 buried in the trench 2, i.e., the center of the conductive layer 4 buried in the trench 2 in the width direction of the trench 2, is removed from the surface to the bottom of the trench 2 through the opening portion 3d, which is formed in the oxide film 3b in the stripe-shaped pattern, by highly directional dry etching, such as RIE or ion milling, using the remaining oxide film 3b as an etching mask, to form a hole 9 as illustrated in FIG. 12.

In this process, the conductive layer 4 buried in the trench 2 is divided into two conductors, i.e., the gate electrode 4a and the in-trench wiring layer 4b, which are formed on the side wall of the trench 2 in the width direction so as to face each other, with a gap formed by the hole 9 interposed therebetween. In the trench 2, the gate electrode 4a is formed on the side wall of the active mesa region 5, with the gate insulating film 3a interposed therebetween, and is used as the gate electrode of the trench gate IGBT. In the trench 2, the in-trench wiring layer 4b is formed on the side of the floating mesa region 6, with the gate insulating film 3a interposed therebetween, is electrically insulated from the gate electrode 4a, and is electrically connected to the emitter electrode 10, which will be described below, in order to reduce feedback capacity.

Figure 13:
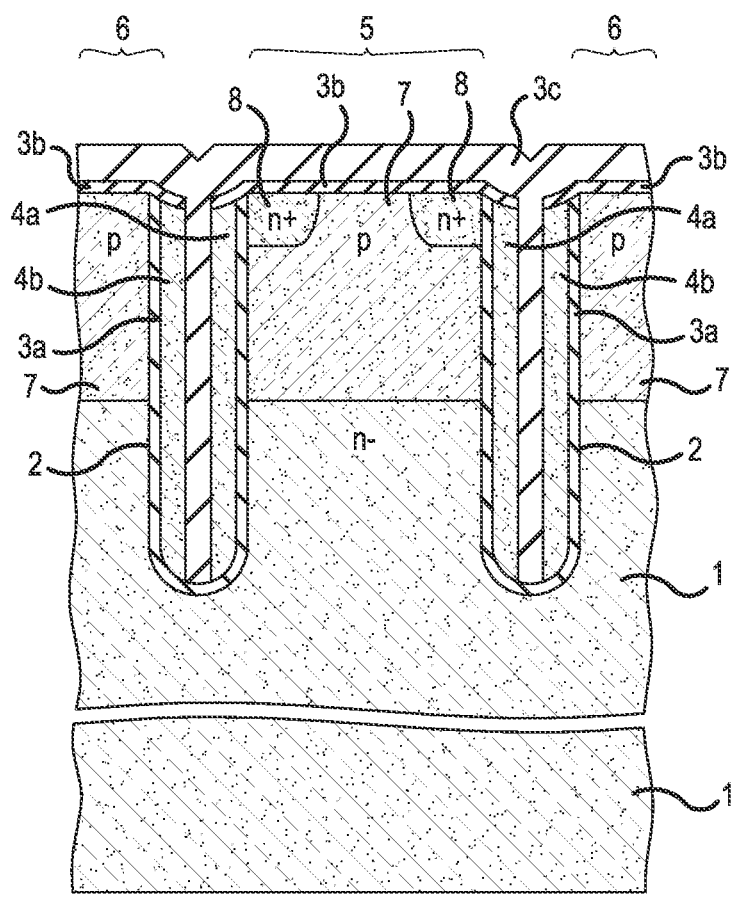
FIG. 13 is a cross-sectional view illustrating a main portion of the flow of the process of manufacturing the semiconductor device according to the first embodiment of the invention.

As illustrated in FIG. 13, the hole 9 is filled with an oxide film 3c with high embedability, such as a high-temperature oxide film (HTO), an organic silicon compound film, a phosphosilicate glass (PSG) film, or a borophosphosilicate glass (BPSG) film, as the second insulating film. As the organic silicon compound, the following can be used: tetraethoxysilane (TEOS); octamethylcyclotetrasiloxane (OMCTS); tetrapropoxysilane (TPOS); or tetramethylcyclotetrasiloxane (TMCTS). I.e., the gap between the gate electrode 4a and the in-trench wiring layer 4b (between two conductors) is filled with the oxide film 3c with high fluidity. In this process, the oxide film 3c is also formed on the surface of the semiconductor substrate 1.

Figure 14:
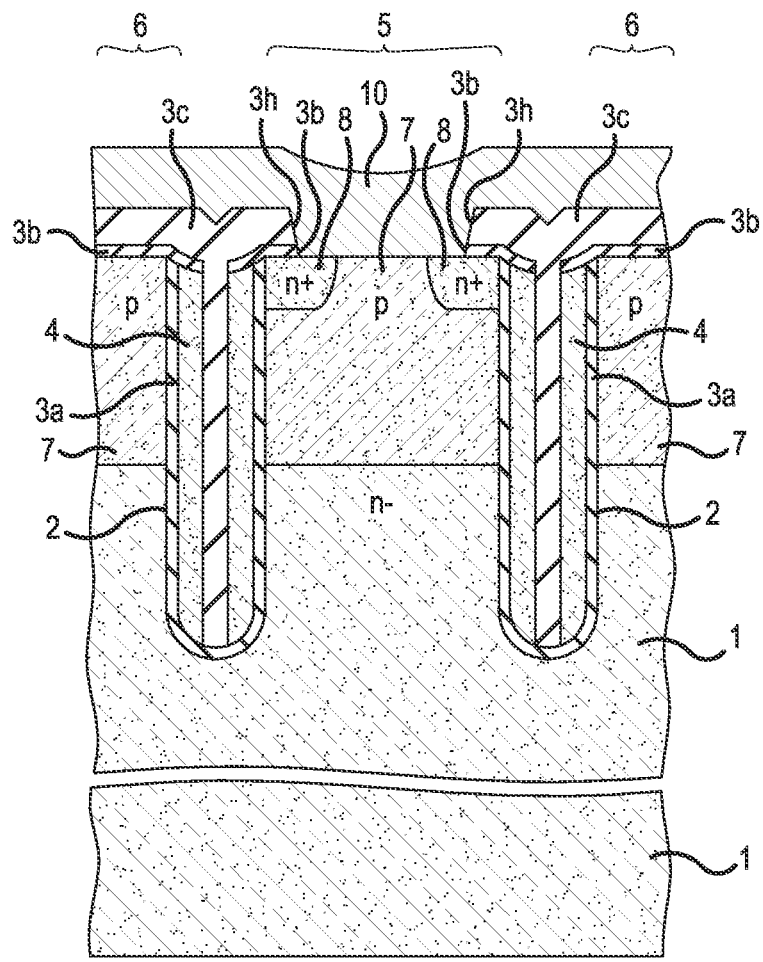
FIG. 14 is a cross-sectional view illustrating a main portion of the flow of the process of manufacturing the semiconductor device according to the first embodiment of the invention.

Then, the insulating films, i.e., the oxide film 3c and the oxide film 3b on the channel forming region 7 and the main electrode region 8 are selectively removed to form an opening portion 3h, as illustrated in FIG. 14.

Then, a metal film, such as an aluminum (Al) film or an aluminum alloy film made of Al—Si, Al—Cu, or Al—Cu—Si, is formed on the entire surface of the semiconductor substrate 1 including the inside of the opening portion 3h by, for example, a sputter deposition method. Then, the metal film is patterned to form the emitter electrode 10, which comes into contact with, i.e., is electrically and mechanically connected to, both the channel forming region 7 and the main electrode region 8 through the opening portion 3h, as a metal electrode, as illustrated in FIG. 14.

In the method for manufacturing the semiconductor device (trench gate IGBT) according to the first embodiment, a laminated film of the oxide film 3b and the oxide film 3c illustrated in FIG. 14 corresponds to the oxide film 3e as the insulating film illustrated in FIG. 1. The surface of a portion of the channel forming region 7 in which the main electrode region 8 is not formed in the floating mesa region 6 is covered with the oxide film 3e (3b and 3c). Therefore, the channel forming region 7 and the emitter electrode 10 which form the floating mesa region 6 are electrically insulated from each other. A polyimide resin film may be additionally formed as a passivation film (not illustrated) on the surface of the emitter electrode 10. In order to complete a power device, a protective tape is attached to the surface of the semiconductor substrate 1 subjected to the above-mentioned processes and the opposite surface (which is referred to as the rear surface) of the semiconductor substrate 1 with a thickness of 600 μm is ground to a thickness required for a breakdown voltage by, for example, CMP. The ground surface is cleaned and the buffer layer 11 (or a field stop (FP) layer) and the collector region (second main electrode region) 12 are formed on the rear surface of the semiconductor substrate 1. Then, the collector electrode 13 is formed on the rear surface thereof. In this way, a wafer process for the semiconductor device (trench gate IGBT) according to the first embodiment of the invention illustrated in FIG. 1 ends.

Figure 30:
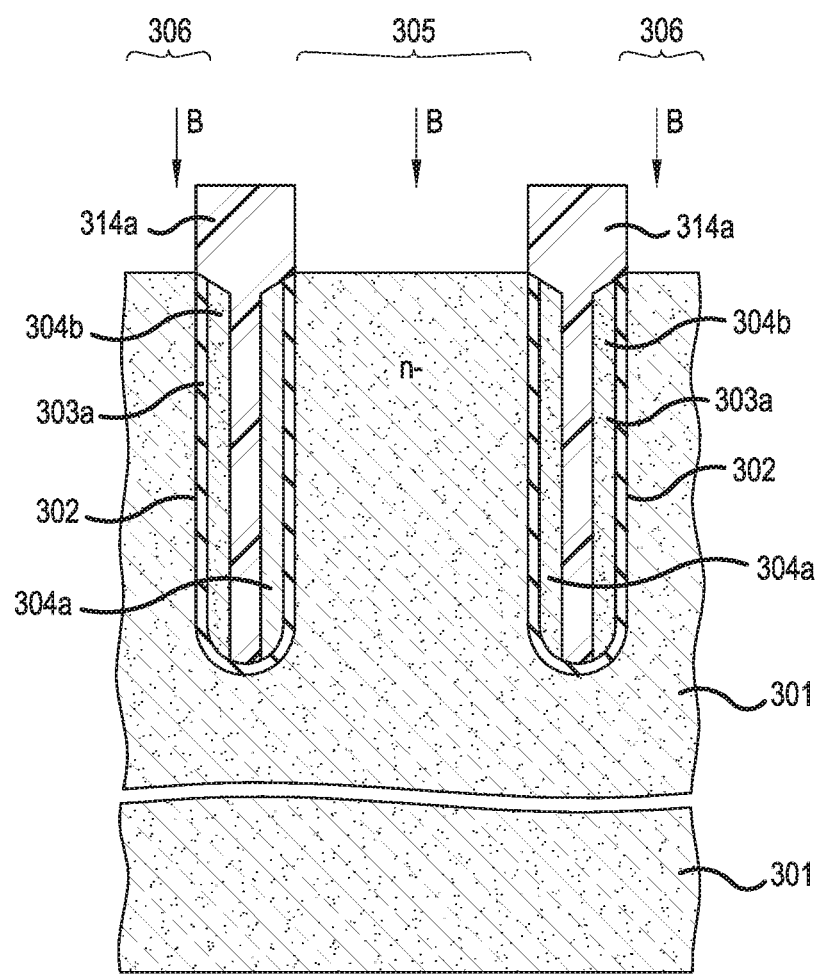
FIG. 30 is a cross-sectional view illustrating a main portion of the flow of the process of manufacturing the trench gate IGBT according to the related art.
Figure 31:
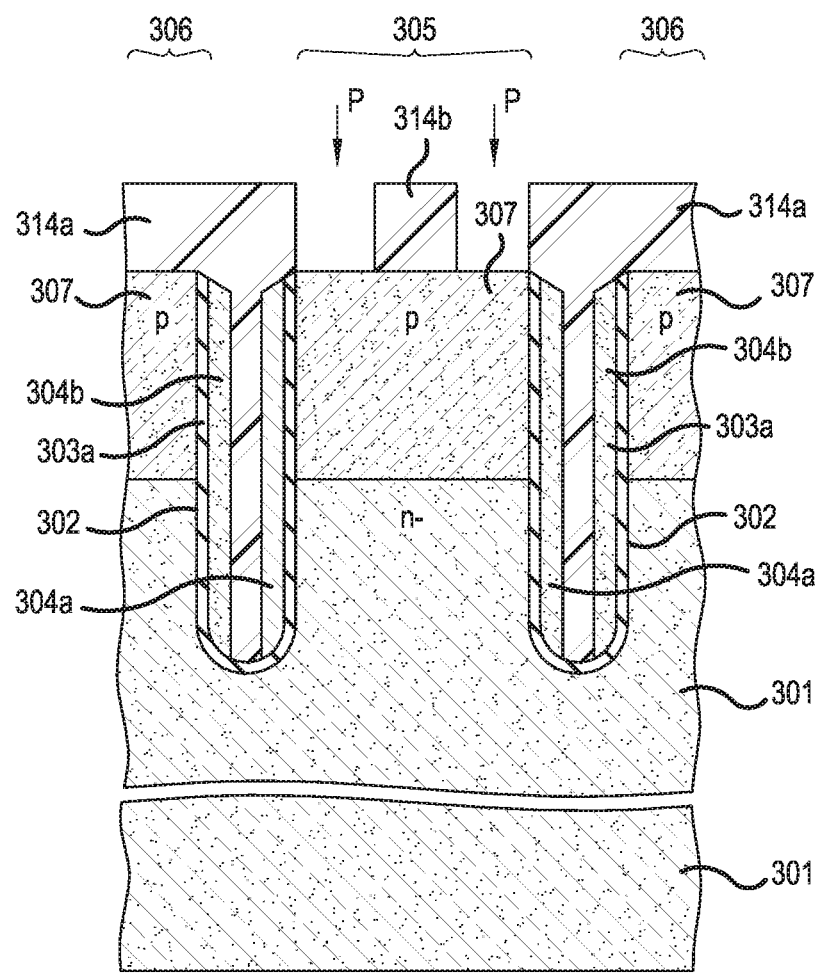
FIG. 31 is a cross-sectional view illustrating a main portion of the flow of the process of manufacturing the trench gate IGBT according to the related art.
Figure 32:
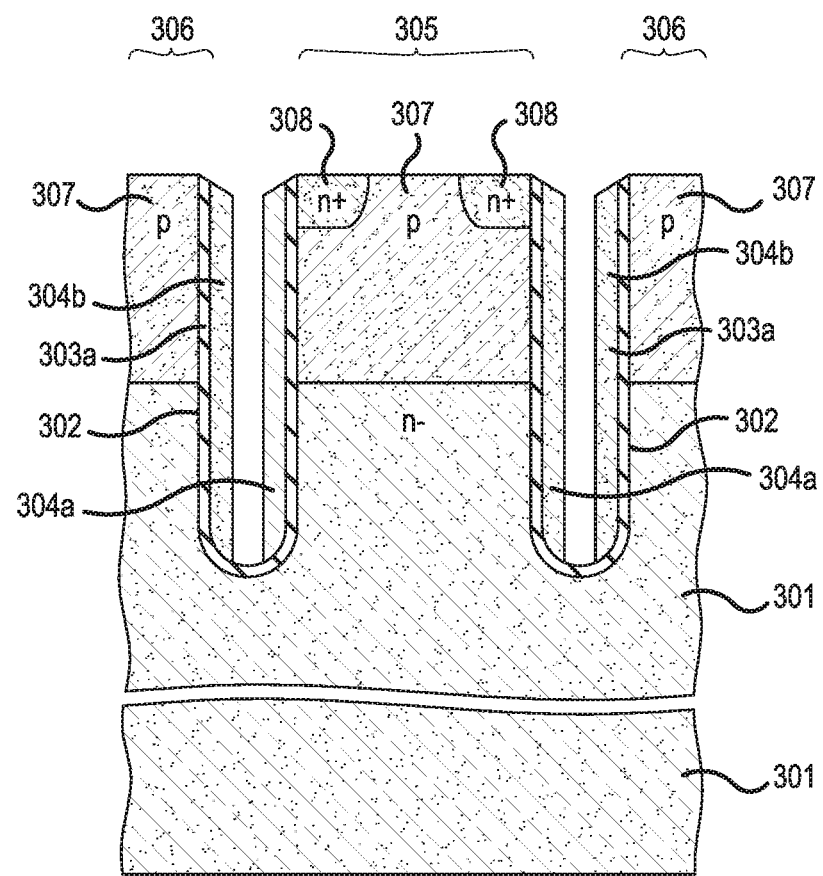
FIG. 32 is a cross-sectional view illustrating a main portion of the flow of the process of manufacturing the trench gate IGBT according to the related art.
Figure 33:
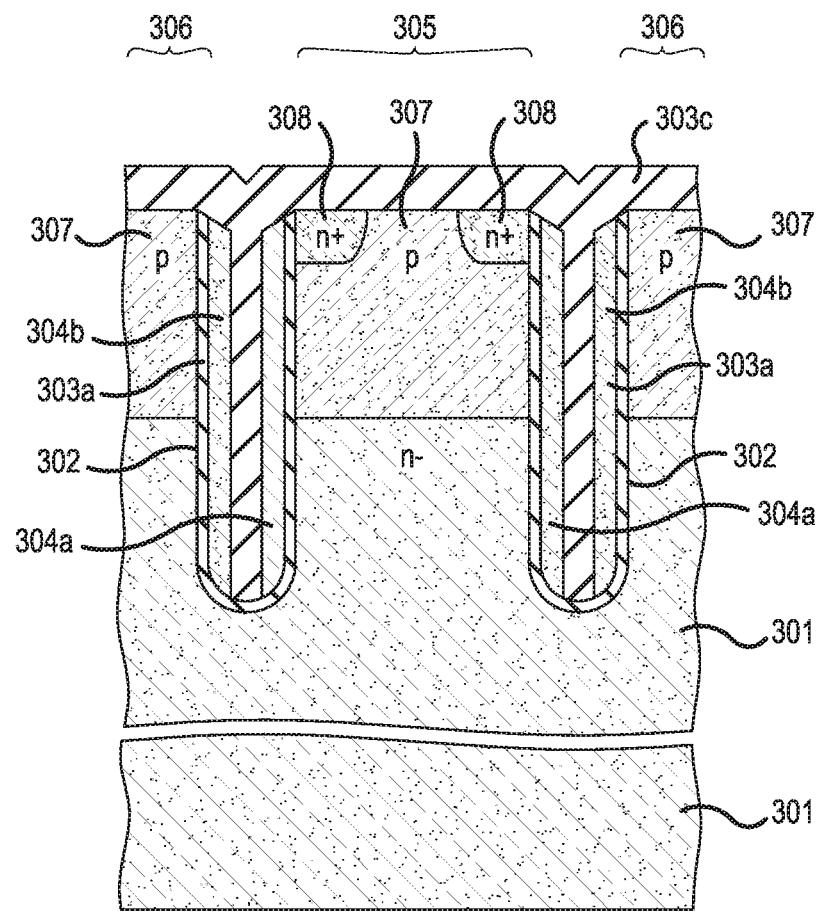
FIG. 33 is a cross-sectional view illustrating a main portion of the flow of the process of manufacturing the trench gate IGBT according to the related art.
Figure 34:
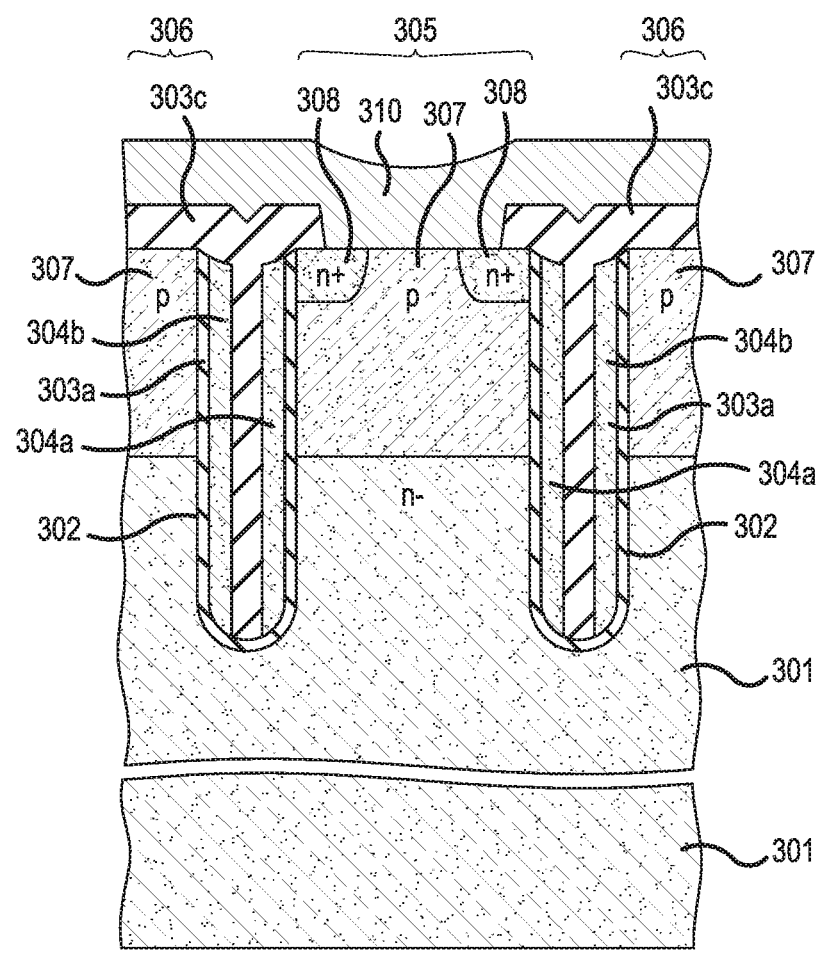
FIG. 34 is a cross-sectional view illustrating a main portion of the flow of the process of manufacturing the trench gate IGBT according to the related art.

In the trench gate IGBT manufacturing method according to the related art, as illustrated in FIGS. 28 to 33, after the doped polysilicon layer 304 provided in the trench 302 is divided into two conductors (the doped polysilicon electrodes 304a and 304b) which are formed on the side wall of the trench 302 so as to face each other with a gap therebetween (see FIG. 28) and before the gap between the two conductors (electrodes) is filled with the oxide film 303c (see FIG. 33), two ion implantation processes are performed in order to form the p-type base region 307 and the n$^+$ emitter region 308 (see FIGS. 30 and 31). Therefore, the photoresists 314a and 314b which are used as masks during ion implantation get into the gap between the two conductors (304a and 304b).

In contrast, according to the method for manufacturing the semiconductor device (trench gate IGBT) according to the first embodiment of the invention, as illustrated in FIGS. 12 and 13, the conductive layer 4 provided in the trench 2 is divided into two conductors (the gate electrode 4a and the in-trench wiring layer 4b) which are provided on the side wall of the trench 2 so as to face each other, with a gap (hole 9) interposed therebetween, and the gap between the two conductors is filled with the oxide film 3c. Two ion implantation processes for forming the channel forming region 7 and the main electrode region 8 are not performed during the period of time from when the conductive layer 4 provided in the trench 2 is divided into the two conductors (the gate electrode 4a and the in-trench wiring layer 4b) to when the gap (hole 9) between the two conductors is filled with the oxide film 3c. In the method for manufacturing the semiconductor device according to the first embodiment of the invention, before the conductive layer 4 provided in the trench 2 is divided into the two conductors (the gate electrode 4a and the in-trench wiring layer 4b), i.e., with the entire trench 2 being filled with the conductive layer 4, the two ion implantation processes for forming the channel forming region 7 and the main electrode region 8 are performed (see FIGS. 7 and 8). Therefore, according to the method for manufacturing the semiconductor device of the first embodiment of the invention, the photoresist which is used as the mask during ion implantation does not get into the trench 2, unlike the trench gate IGBT manufacturing method according to the related art.

Second Embodiment

Figure 16:
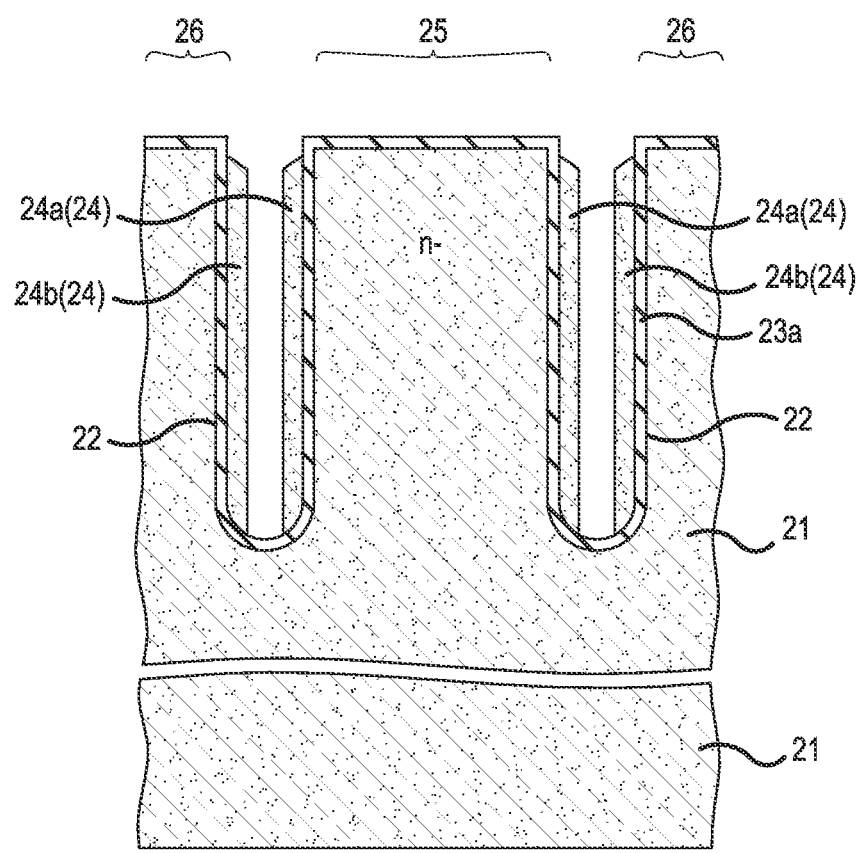
FIG. 16 is a cross-sectional view illustrating a main portion of the flow of a process of manufacturing a semiconductor device (trench gate IGBT) according to a second embodiment of the invention.
Figure 25:
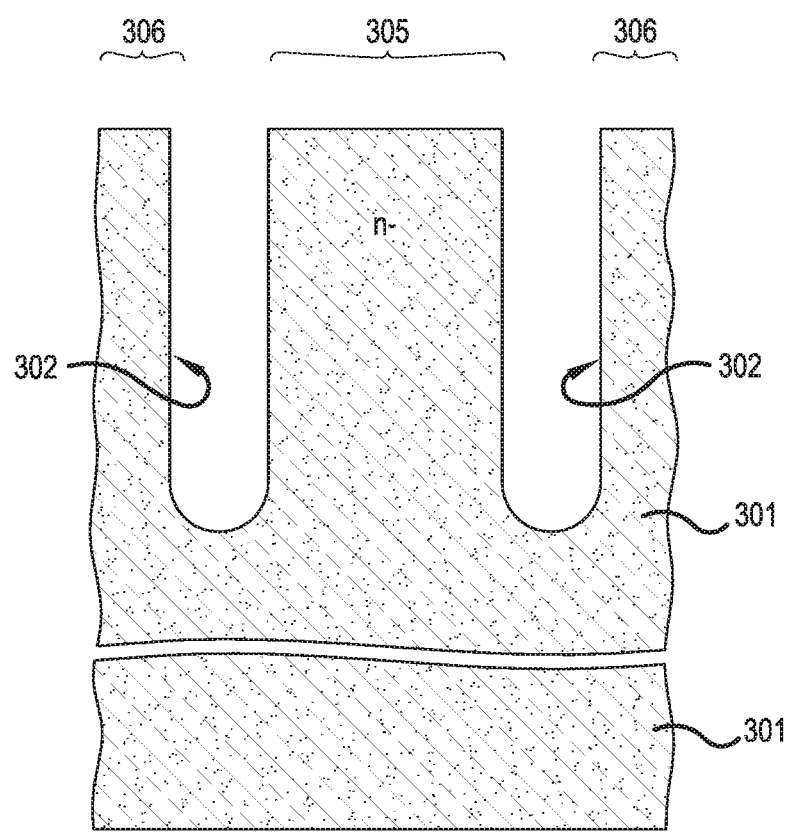
FIG. 25 is a cross-sectional view illustrating a main portion of the flow of a process of manufacturing the trench gate IGBT according to the related art.
Figure 26:
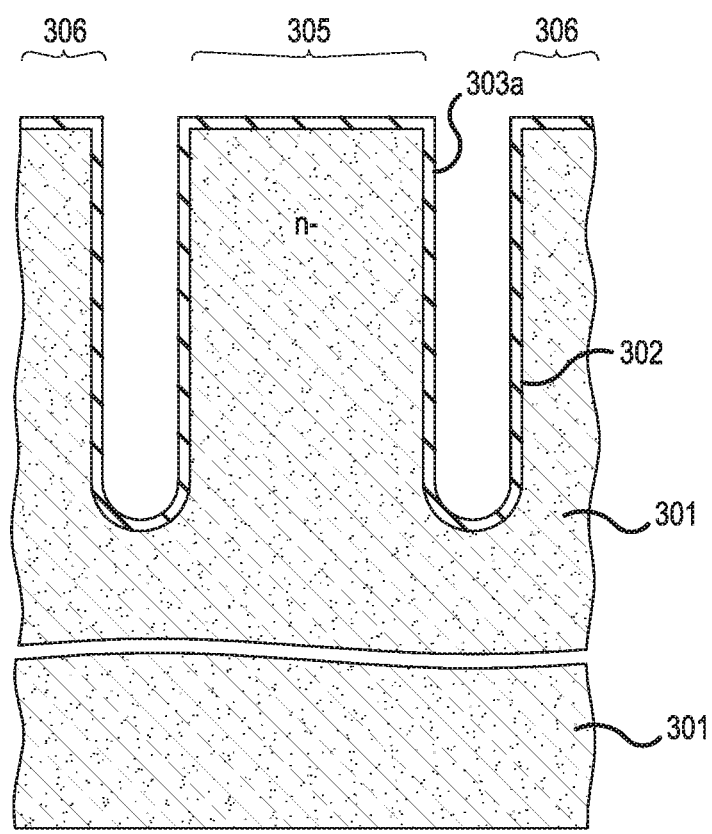
FIG. 26 is a cross-sectional view illustrating a main portion of the flow of the process of manufacturing the trench gate IGBT according to the related art.
Figure 27:
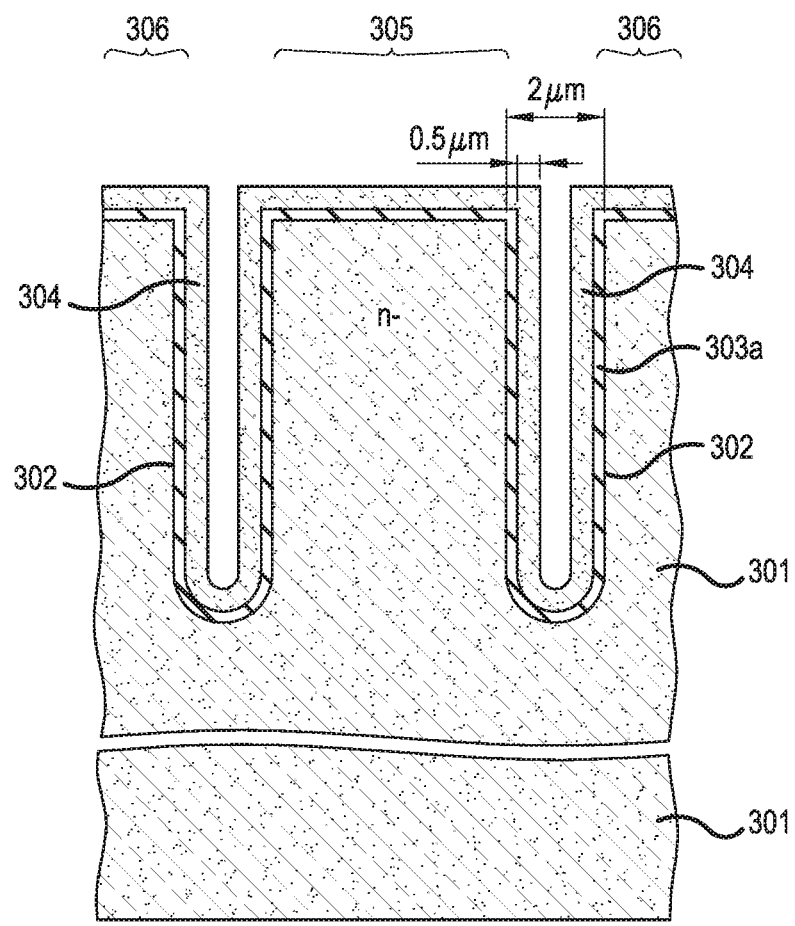
FIG. 27 is a cross-sectional view illustrating a main portion of the flow of the process of manufacturing the trench gate IGBT according to the related art.
Figure 28:
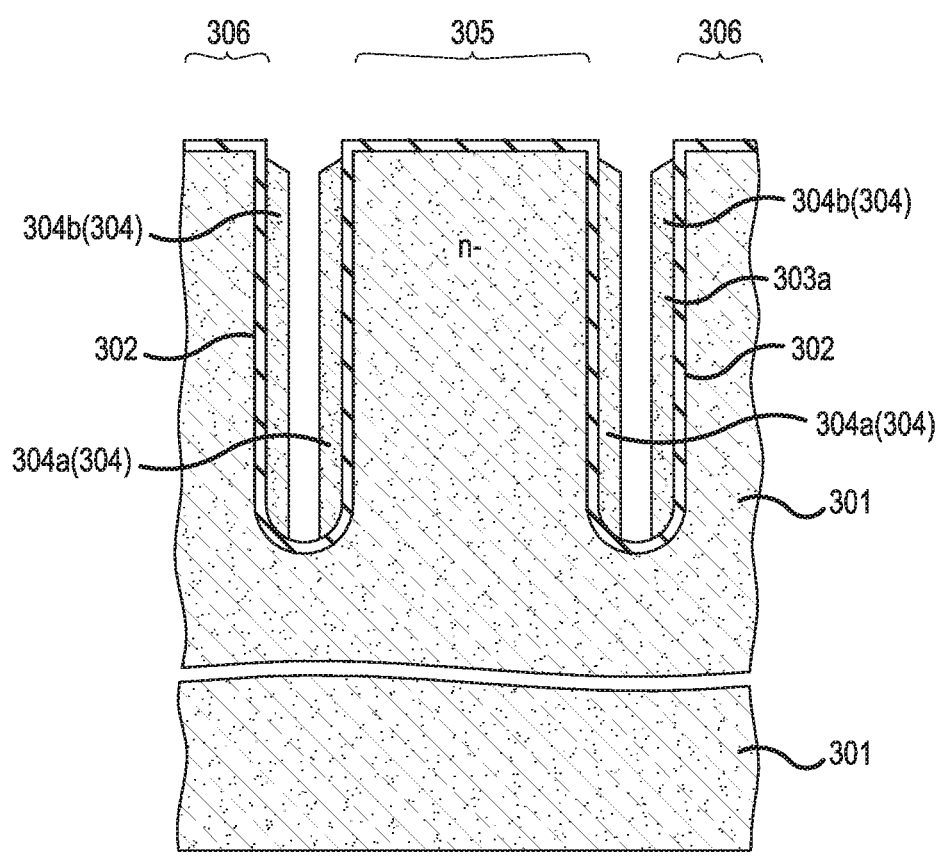
FIG. 28 is a cross-sectional view illustrating a main portion of the flow of the process of manufacturing the trench gate IGBT according to the related art.
Figure 29:
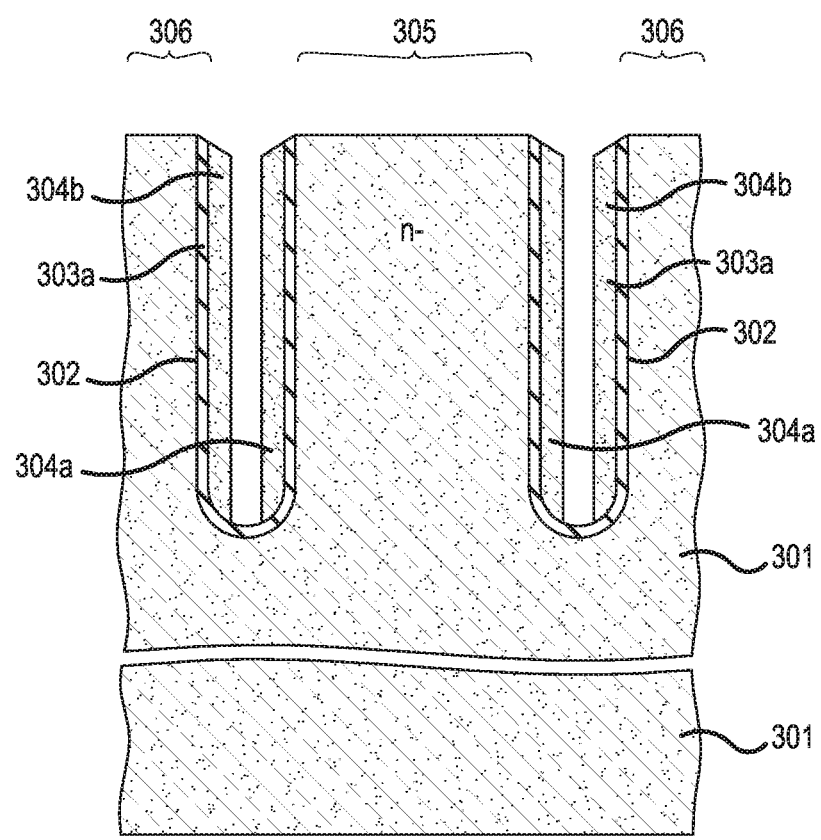
FIG. 29 is a cross-sectional view illustrating a main portion of the flow of the process of manufacturing the trench gate IGBT according to the related art.

In the first embodiment, as illustrated in FIG. 4, the conductive layer 4 is formed with a sufficient thickness to fill up the trench 2. In contrast, in a semiconductor device manufacturing method according to a second embodiment, the same process as that described with reference to FIGS. 25 and 26 is performed to form a trench 22 and a gate insulating film 23a (see FIG. 16) as a first insulating film in a semiconductor substrate 21 of a first conductivity type (n$^-$ type) which is made of, for example, single-crystal silicon. Then, similarly to FIGS. 27 and 28, as a conductive layer 24, a doped polysilicon layer is formed with a thickness that does not fill up the trench 22, i.e., a thickness that allows a space to be formed in the trench 22, in the trench 22 of the semiconductor substrate 21 by, for example, a CVD method. For example, the conductive layer 24 with a thickness of about 0.5 μm is formed in the trench with a width of 2 μm. The conductive layer 24 is etched back by dry etching which is highly directional, such as RIE or ion milling, so that a portion of the conductive layer 24 on the surface of the semiconductor substrate 21 and at the bottom of the trench 22 is removed. In this way, as illustrated in FIG. 16, the conductive layer 24 is divided so as to be attached to both side walls of the trench 22, and two conductors, i.e., a gate electrode 24a and an in-trench wiring layer 24b of the conductive layer 24 are formed. The gate electrode 24a and the in-trench wiring layer 24b are formed on the side wall of the trench 22 in the width direction along the inner wall surface of the trench 22 and are divided so as to face each other, with a gap, which is formed by reducing the thickness of the conductive layer 24, interposed therebetween. The gate electrode 24a is formed on the side wall of an active mesa region 25 in the trench 22, with a gate insulating film 23a interposed, and forms a gate electrode of a trench gate IGBT. The in-trench wiring layer 24b is formed on the side wall of the floating mesa region 26 in the trench 22, with the gate insulating film 23a interposed therebetween, is electrically separated from the gate electrode 24a, and is electrically connected to an emitter electrode 30, which will be described below in order to reduce feedback capacity. The gate insulating film 23a is, for example, a silicon dioxide film which is produced by performing a thermal oxidation process on the semiconductor substrate 21.

Figure 17:
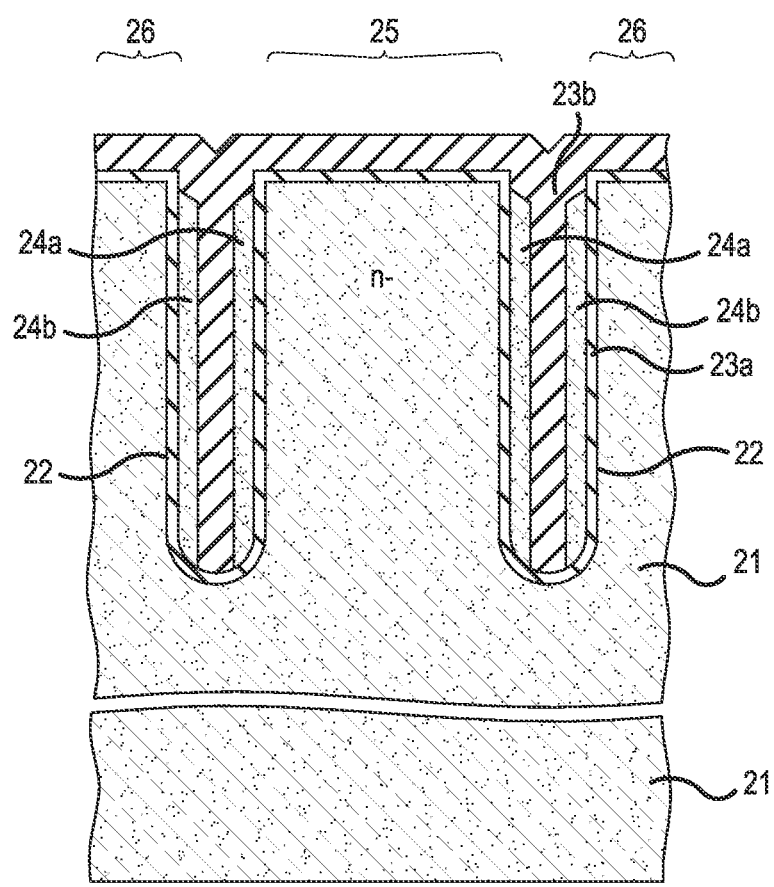
FIG. 17 is a cross-sectional view illustrating a main portion of the flow of the process of manufacturing the semiconductor device according to the second embodiment of the invention.

Then, as illustrated in FIG. 17, an oxide film 23b with a sufficient thickness to fill up the trench 22 is formed as a second insulating film on the surface of the semiconductor substrate 21 by, for example, a CVD method. An oxide film with high embedability, such as an HTO film, an organic-silicon-based compound film, a TEOS film, a PSG film, or a BPSG film, may be used as the oxide film 23b. In this process, the gap between the gate electrode 24a and the in-trench wiring layer 24b (two conductors) is filled with the oxide film 23b.

Figure 18:
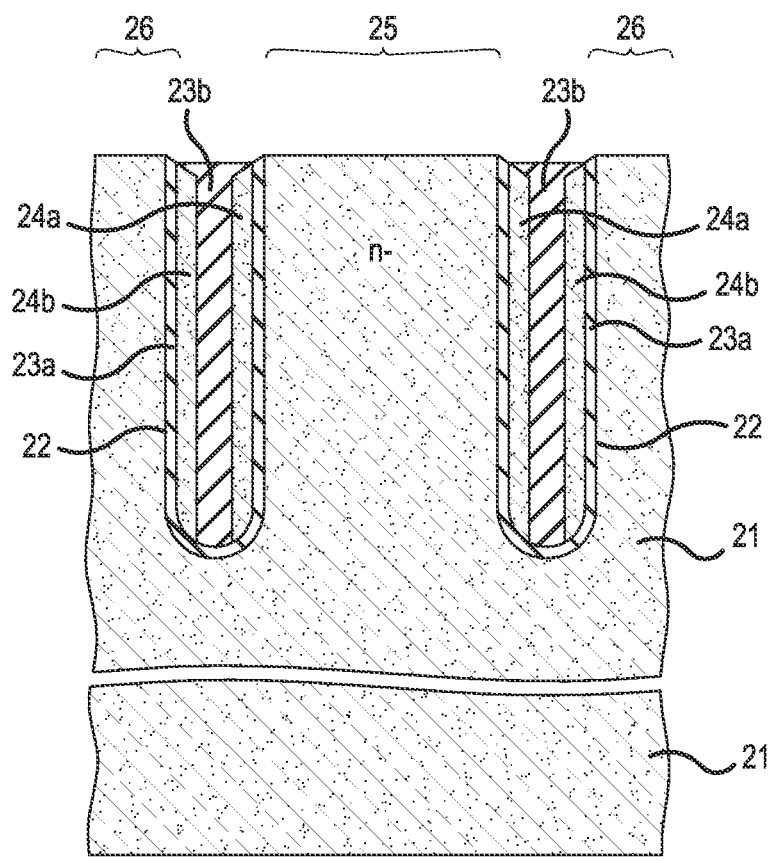
FIG. 18 is a cross-sectional view illustrating a main portion of the flow of the process of manufacturing the semiconductor device according to the second embodiment of the invention.

Then, as illustrated in FIG. 18, the insulating films, i.e., the oxide film 23b and the gate insulating film 23a on the surface of the semiconductor substrate 21, are selectively removed by etching such that the surface of the semiconductor substrate 21 is exposed. In this way, the gate insulating film 23a, the oxide film 23b, and the two conductors (the gate electrode 24a and the in-trench wiring layer 24b) which face each other, with the oxide film 23b interposed therebetween, are selectively buried only in the trench 22 and the surface of the semiconductor substrate 21 is substantially flat.

Figure 19:
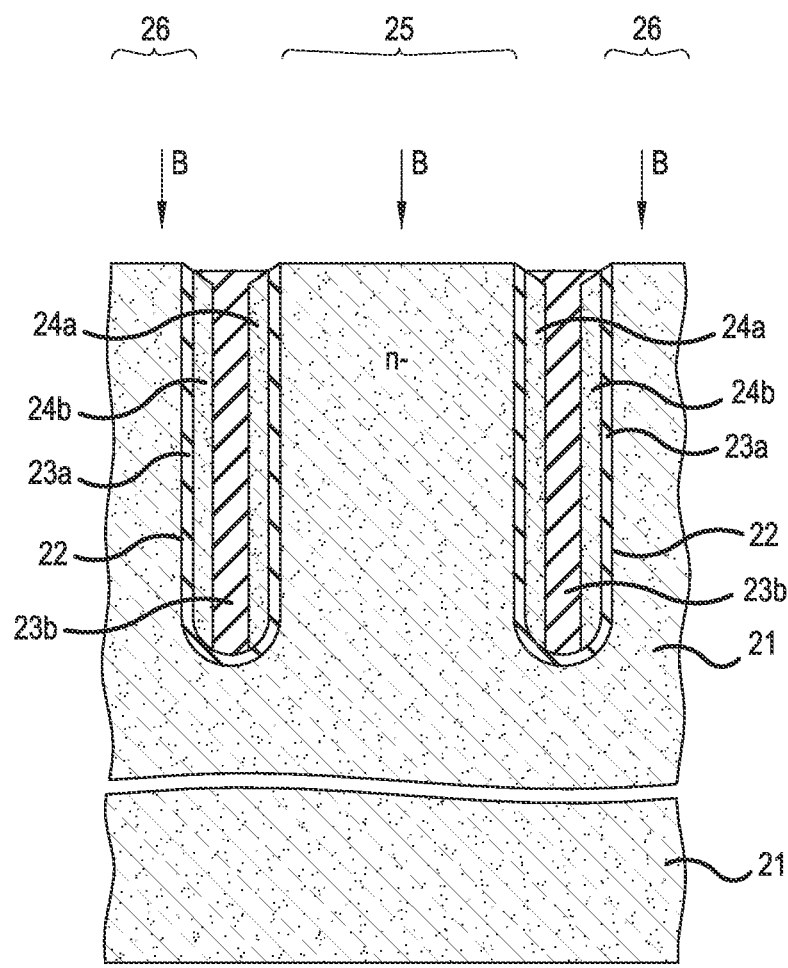
FIG. 19 is a cross-sectional view illustrating a main portion of the flow of the process of manufacturing the semiconductor device according to the second embodiment of the invention.

In this state, a channel forming region (base region) 27 of the second conductivity type (p-type) and a main electrode region (emitter region) 28 of the first conductivity type (n$^+$) are formed in the surface of a portion of the semiconductor substrate 1 between adjacent trenches 22 in a required pattern by photolithography and ion implantation. As illustrated in FIG. 19, for example, boron (B) ions are implanted as second-conductivity-type impurity ions in the entire surface of the semiconductor substrate 21, in order to form the channel forming region 27 (FIG. 19). In this ion implantation process, the trench 22 is filled with two conductors (the gate electrode 24a and the in-trench wiring layer 24b), which are doped polysilicon layers with high impurity concentration, and the oxide film 23b, and it is not necessary to protect the inside and bottom of the trench 22. Therefore, it is possible to implant impurity ions into the front surface of the semiconductor substrate 21, without using a photoresist mask. Then, a heat treatment for activating the implanted boron ions is performed to form the channel forming region 27 (see FIG. 20) doped with the second-conductivity-type impurities and the active mesa region 25 is defined between the trenches 22. The surface of the channel forming region 27 which faces the side wall of the trench 22 is a portion in which a channel is formed. In this process, the channel forming region 27 is also formed in the floating mesa region 26.

Figure 20:
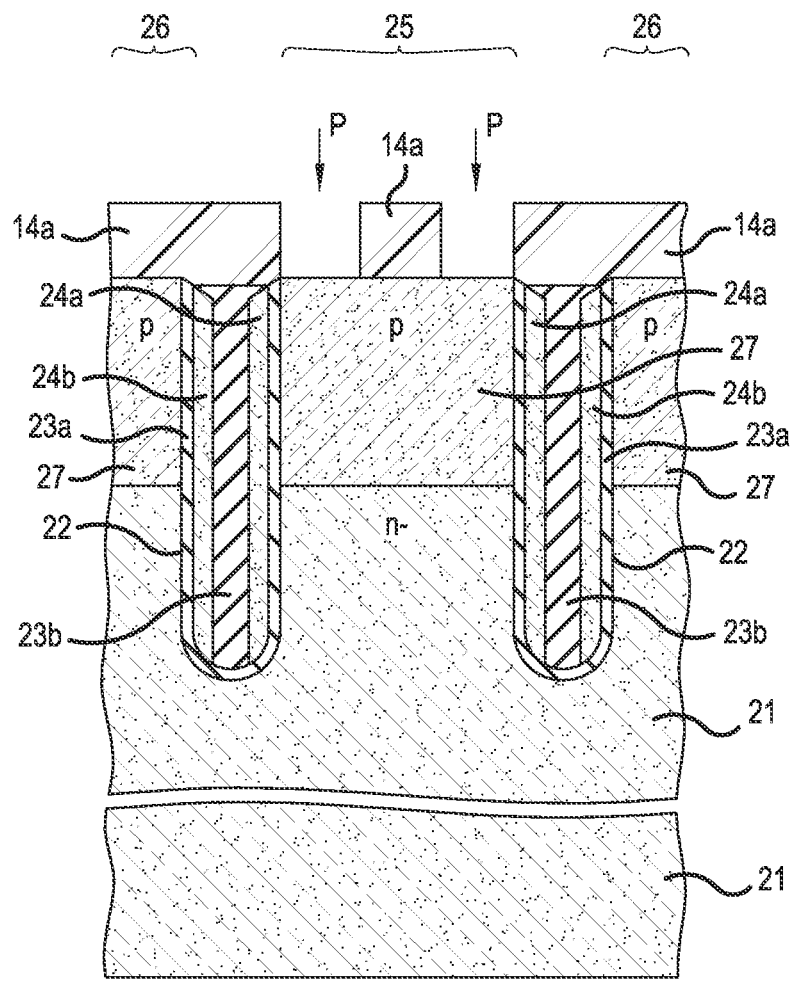
FIG. 20 is a cross-sectional view illustrating a main portion of the flow of the process of manufacturing the semiconductor device according to the second embodiment of the invention.
Figure 21:
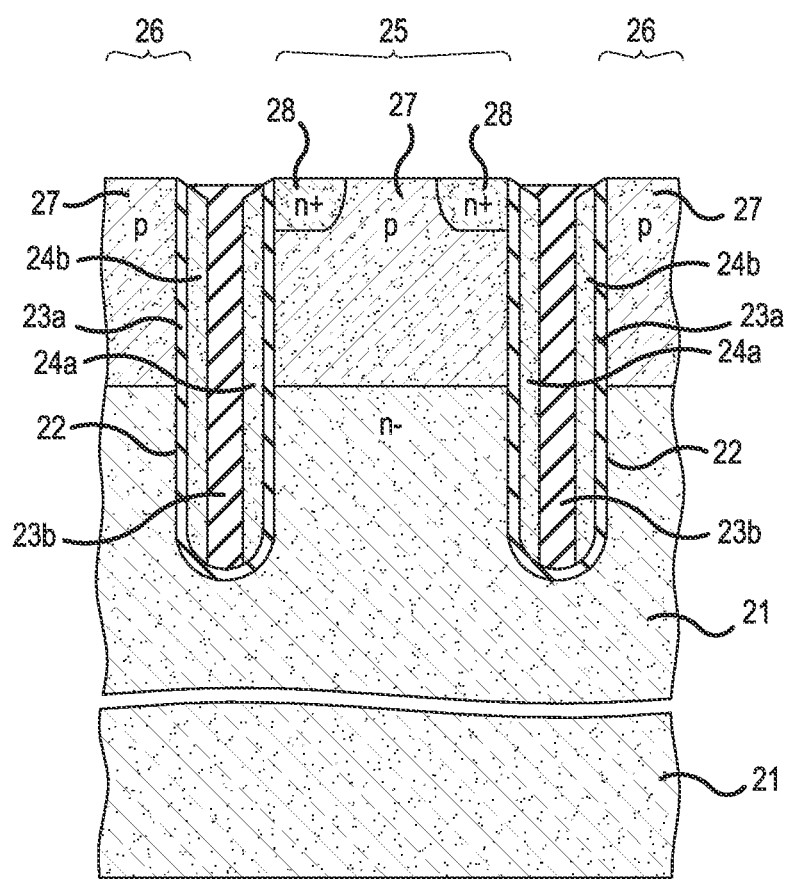
FIG. 21 is a cross-sectional view illustrating a main portion of the flow of the process of manufacturing the semiconductor device according to the second embodiment of the invention.

As illustrated in FIG. 20, for example, phosphorous (P) ions are selectively implanted as first-conductivity-type impurity ions, using a photoresist 14a which is formed by photolithography as an impurity ion implantation mask, in order to form the main electrode region 28. Here, in the ion implantation process, the photoresist 14a is used as the impurity ion implantation mask. Since two conductors (the gate electrode 24a and the in-trench wiring layer 24b) and the oxide film 23b are buried in the trench 22, the photoresist is prevented from getting into the trench 22 and it is not necessary to remove the photoresist after the ion implantation process. Then, the photoresist 14a is removed and a heat treatment for activating the implanted phosphorous ions is performed to form the main electrode region 28 doped with the first-conductivity-type impurity ions, as illustrated in FIG. 21. In this process, the main electrode region 28 is not formed in the floating mesa region 26.

In this way, the channel forming region 27 and the main electrode region 28 are formed by photolithography and ion implantation. Therefore, it is possible to form the channel forming region 27 and the main electrode region 28 in the surface of the active mesa region 25, while preventing the residue of the resist from remaining in the trench 22. The main electrode region 28 is formed in a surface layer in the channel forming region 27.

Figure 22:
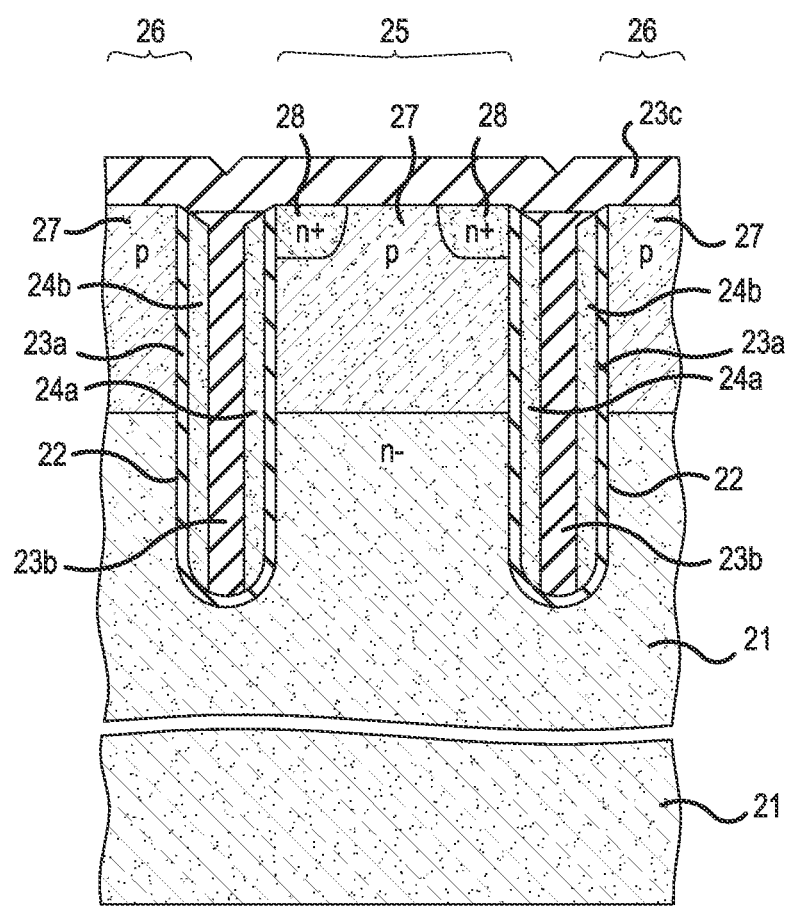
FIG. 22 is a cross-sectional view illustrating a main portion of the flow of the process of manufacturing the semiconductor device according to the second embodiment of the invention.
Figure 23:
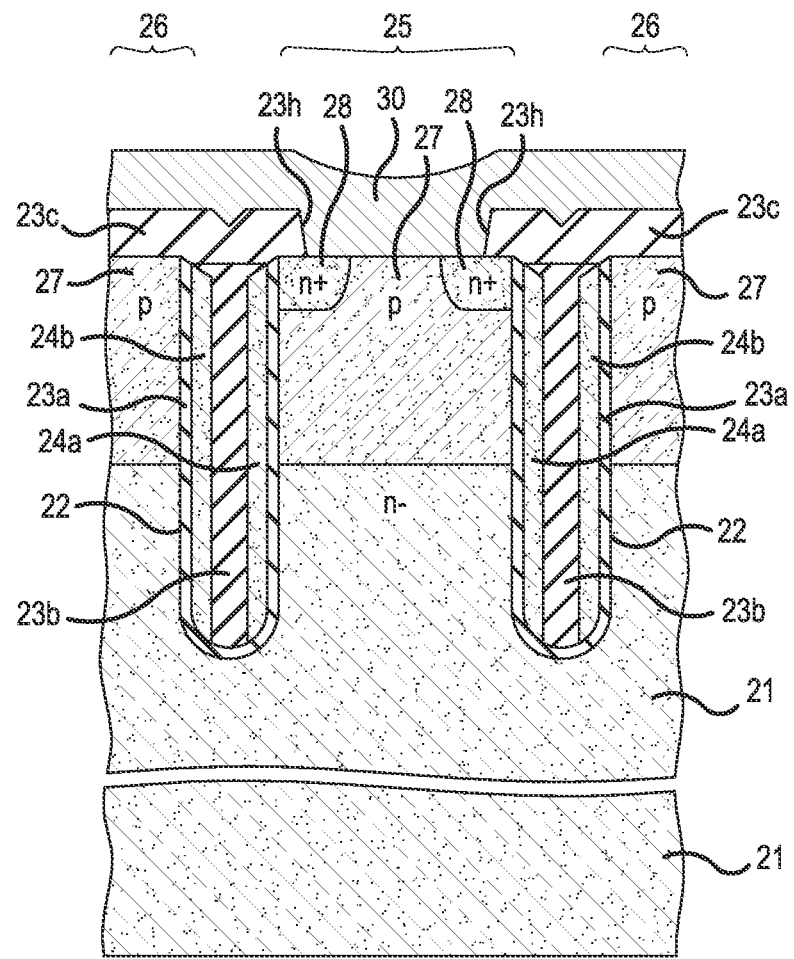
FIG. 23 is a cross-sectional view illustrating a main portion of the flow of the process of manufacturing the semiconductor device according to the second embodiment of the invention.
Figure 24A:
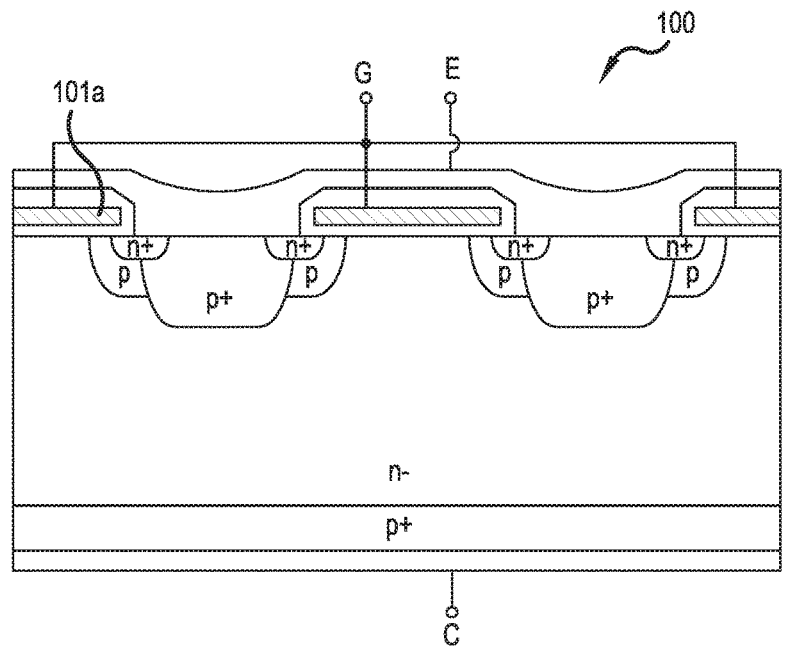
FIG. 24 is a cross-sectional view illustrating the schematic structure of an IGBT according to the related art (FIG. 24(a) is a cross-sectional view illustrating a planar gate IGBT and FIG. 24(b) is a cross-sectional view illustrating a trench gate IGBT)
Figure 24B:
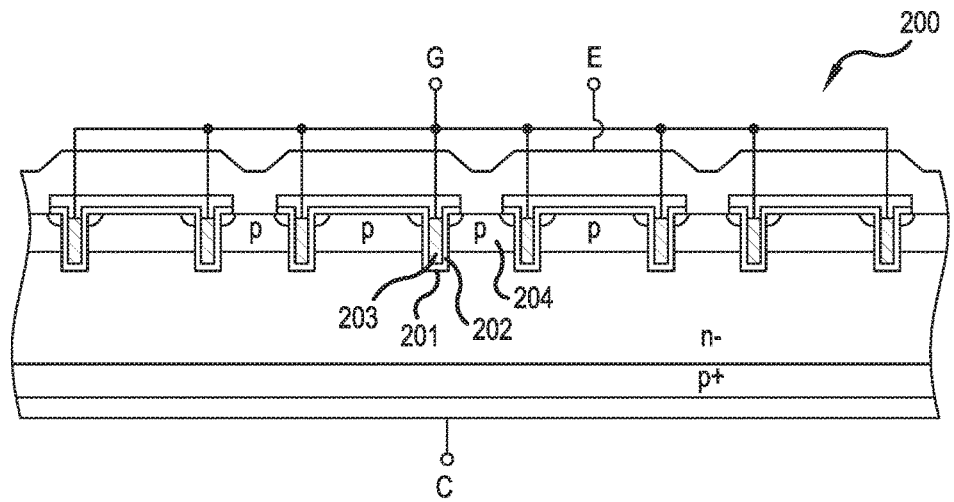

As illustrated in FIG. 22, an oxide film 23c is formed as a third insulating film on the entire surface of the semiconductor substrate 1 by, for example, a CVD method. Then, as illustrated in FIG. 23, the insulating film, i.e., the oxide film 23c on the channel forming region 27 and the main electrode region 28 is selectively removed by photolithography to form an opening portion 23h (see FIG. 23), similarly to Example 1.

Then, a metal film, such as an aluminum film or an aluminum alloy film, is formed on the entire surface of the semiconductor substrate 21 including the inside of the opening portion 23h by, for example, a sputter deposition method. Then, the metal film is patterned to form the emitter electrode (first main electrode) 30, which comes into contact with, i.e., is electrically and mechanically connected to both the channel forming region 27 and the main electrode region 8 through the opening portion 23h, as a metal electrode, as illustrated in FIG. 23. The subsequent wafer process is the same as that in the first embodiment and becomes a wafer process for the semiconductor device (trench gate IGBT) according to the second embodiment of the invention.

In the semiconductor device (trench gate IGBT) manufacturing method according to the second embodiment of the invention, as illustrated in FIGS. 16 and 17, the conductive layer 24 provided in the trench 22 is divided into two conductors (the gate electrode 24a and the in-trench wiring layer 24b) which are provided on the side wall of the trench 22 so as to face each other, with a gap therebetween, and the gap between the two conductors is filled with the oxide film 23b. Two ion implantation processes for forming the channel forming region 27 and the main electrode region 28 are not performed during the period of time from when the conductive layer 24 provided in the trench 22 is divided into the two conductors (the gate electrode 24a and the in-trench wiring layer 24b) to when the gap between the two conductors is filled with the oxide film 23b. In the semiconductor device manufacturing method according to the second embodiment of the invention, after the gap between two conductors (the gate electrode 24a and the in-trench wiring layer 24b) in the trench 22 is filled with the oxide film 23b, i.e., with the entire trench 22 being filled with two conductors (the gate electrode 24a and the in-trench wiring layer 24b) and the oxide film 23b, the two ion implantation processes for forming the channel forming region 27 and the main electrode region 28 are performed. Therefore, in the semiconductor device manufacturing method according to the second embodiment of the invention, the photoresist which is used as the mask during ion implantation does not get into the trench 22, similarly to the semiconductor device manufacturing method according to the first embodiment of the invention.

Other Embodiments

In the semiconductor device manufacturing methods according to the first and second embodiments of the invention, the npn trench gate IGBT including the n-type main electrode region has been described. However, the invention is not limited thereto. For example, the invention can be applied to manufacture a pnp trench gate IGBT including a p-type main electrode region (first main electrode region). In addition, the invention can be applied to manufacture a trench gate MISFET of an n channel conductivity type or a p channel conductivity type. Furthermore, the invention can be applied to a MOS composite device, such as a depletion-mode thyristor (DMT) or a field controlled thyristor (FCT).

When the collector region is not formed on the rear surface side of the semiconductor substrate, it is easy to form a trench gate MOSFET or a trench gate MOSSIT as another example of the insulated gate semiconductor device.

As described above, according to the semiconductor device manufacturing methods of the first and second embodiments of the invention, it is possible to achieve a semiconductor device manufacturing method including a process of preventing a photoresist from remaining the trench.

In the semiconductor device manufacturing methods according to the first and second embodiments of the invention, when impurities for forming the channel forming region are introduced, the photoresist is not used as a mask for selectively introducing the impurities. Therefore, it is possible to reduce the number of photoresist masks (reticles) and to reduce costs, as compared to the related art. I.e., a reduction in the number of masks makes it possible to reduce the number of processes including a series of a photoresist applying process, a photoresist exposure process, a photoresist development process, a cleaning process, and a drying process, in addition to reducing the costs of the mask. Therefore, it is possible to significantly reduce the process costs of the semiconductor device. In addition, it is possible to reduce a defect rate due to a foreign material and to improve the yield and reliability of the semiconductor device.

In the semiconductor device manufacturing methods according to the first and second embodiments of the invention, the silicon semiconductor substrate is used as the semiconductor substrate. However, the invention is not limited thereto. For example, the invention can also be applied to manufacture a trench gate semiconductor device using a semiconductor substrate made of silicon carbide (SiC) or gallium nitride (GaN).

In the semiconductor device manufacturing methods according to the first and second embodiments of the invention, the doped polysilicon layer is used as the conductive layer. However, as described above, the invention is not limited thereto. For example, the invention can also be applied to a trench gate semiconductor device using the following layer as the conductive layer: a high-melting-point metal layer, such as a platinum (Pt) layer, a tungsten layer, or a molybdenum layer; a silicide layer; or a composite layer of the silicide layer and the doped polysilicon layer.

As described above, the semiconductor device manufacturing method according to the invention includes a process of preventing a photoresist from remaining in a trench and is useful for a method for manufacturing a semiconductor device in which two conductors are provided in a trench.

Thus, a method for manufacturing a semiconductor device has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

What is claimed is:

1. A method for manufacturing a semiconductor device comprising:
    forming a trench in a surface of a semiconductor substrate of a first conductivity type in a depth direction;
    forming a conductive layer in the trench, with a first insulating film interposed therebetween, so as to be buried in the entire trench;
    forming a third insulating film on the conductive layer;
    forming an opening in the third insulating film;
    etching the conductive layer, via the opening in the third insulating film, thereby dividing the conductive layer into a gate electrode and an in-trench wiring layer which face each other in the trench and filling a gap between the gate electrode and the in-trench wiring layer with a second insulating film, thereby covering at least a portion of the third insulating film that is not subsequently removed;
    introducing second-conductivity-type impurities into the entire surface of the semiconductor substrate to form a channel forming region of a second conductivity type; and
    selectively forming a main electrode region of the first conductivity type in a portion of the channel forming region which is provided along the trench so as to come into contact with the trench.

2. The method for manufacturing a semiconductor device according to claim 1, wherein the channel forming region is formed before the conductive layer is divided.

3. The method for manufacturing a semiconductor device according to claim 1, wherein forming the channel forming region includes implanting second-conductivity-type impurity ions into the entire surface of the semiconductor substrate.

4. The method for manufacturing a semiconductor device according to claim 1, wherein forming the main electrode region includes selectively implanting first-conductivity-type impurity ions into the channel forming region.

5. The method for manufacturing a semiconductor device according to claim 1, wherein the conductive layer is a polysilicon layer doped with impurities.

6. The method for manufacturing a semiconductor device according to claim 1, wherein the first insulating film is formed by thermally oxidizing the semiconductor substrate, and the second insulating film is any one of an HTO film, an organic silicon compound film, a PSG film, and a BPSG film.

7. The method for manufacturing a semiconductor device according to claim 2, wherein forming the channel forming region includes implanting second-conductivity-type impurity ions into the entire surface of the semiconductor substrate.

8. The method for manufacturing a semiconductor device according to claim 2, wherein forming the main electrode region includes selectively implanting first-conductivity-type impurity ions into the channel forming region.

9. The method for manufacturing a semiconductor device according to claim 2, wherein the conductive layer is a polysilicon layer doped with impurities.

10. The method for manufacturing a semiconductor device according to claim 2, wherein the first insulating film is formed by thermally oxidizing the semiconductor substrate, and the second insulating film is any one of an HTO film, an organic silicon compound film, a PSG film, and a BPSG film.

11. The method for manufacturing a semiconductor device according to claim 1, wherein the opening is formed in a portion of the third insulating film corresponding to a center of the trench.

12. The method for manufacturing a semiconductor device according to claim 2, wherein the opening is formed in a portion of the third insulating film corresponding to a center of the trench.

13. The method for manufacturing a semiconductor device according to claim 1, wherein when filling the gap between the gate electrode and the in-trench wiring layer with the second insulating film, the second insulating film is formed directly on the third insulating film.

14. The method for manufacturing a semiconductor device according to claim 1, further comprising forming an electrode on the second insulating film.

15. The method for manufacturing a semiconductor device according to claim 1, further comprising:
    forming an opening portion in the second insulating film and the third insulating film; and
    forming an electrode in the opening portion such that the electrode is formed directly on at least a sidewall of the second insulating film, a sidewall of the third insulating film, and the channel forming region.

16. The method for manufacturing a semiconductor device according to claim 1, wherein when introducing the second-conductivity-type impurities into the entire surface of the semiconductor substrate to form the channel forming region of the second conductivity type, the second-conductivity-type impurities are introduced without using a mask.

* * * * *